Figure 1A:
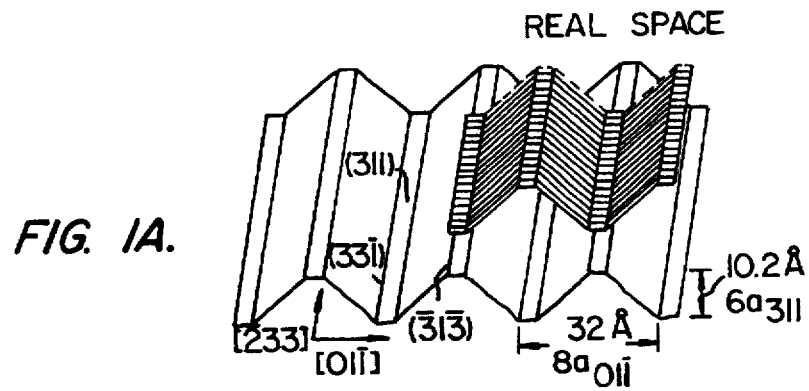

United States Patent [19]
Noetzel et al.

[11] Patent Number: 5,714,765
[45] Date of Patent: Feb. 3, 1998

[54] METHOD OF FABRICATING A COMPOSITIONAL SEMICONDUCTOR DEVICE

[75] Inventors: Richard Noetzel; Nikolai N. Ledentsov, both of Stuttgart; Lutz Daeweritz, Berlin; Klaus Ploog, Stuttgart, all of Germany

[73] Assignee: Max-Planck-Gesellschaft zur Foerderung der Wissenschaften e.V., Goettingen, Germany

[21] Appl. No.: 329,802

[22] Filed: Oct. 26, 1994

Related U.S. Application Data

[63] Continuation of Ser. No. 826,597, Jan. 27, 1992, abandoned.

[30] Foreign Application Priority Data

Jan. 29, 1991 [EP] European Pat. Off. .............. 91101136
Jul. 24, 1991 [EP] European Pat. Off. .............. 91112437

[51] Int. Cl.$^6$ ............................. H01L 21/20; H01L 29/04
[52] U.S. Cl. ........................... 257/17; 257/22; 257/627; 257/628
[58] Field of Search ....................... 257/17, 22, 628, 257/627

[56] References Cited

U.S. PATENT DOCUMENTS

| | | | |
|---|---|---|---|
| 4,872,046 | 10/1989 | Morkoc et al. | 257/628 |
| 4,941,024 | 7/1990 | Hayakawa et al. | 257/22 |
| 4,974,036 | 11/1990 | Kapon | 257/17 |
| 5,065,200 | 11/1991 | Bhat et al. | 257/628 |
| 5,070,387 | 12/1991 | Van Gorkum | 257/627 |

FOREIGN PATENT DOCUMENTS

| | | | |
|---|---|---|---|
| 0 244 140 | 12/1985 | European Pat. Off. . | |
| 0 165 419 | 4/1987 | European Pat. Off. . | |
| A 3728524 | 10/1988 | Germany . | |
| 2-139970 | 5/1990 | Japan | 257/17 |
| 2195050 | 3/1988 | United Kingdom . | |

OTHER PUBLICATIONS

IBM Technical Disclosure 29,2229 (1986).
Wang et al: J.Appl.Phys 60,1834 (1986).

*Primary Examiner*—Donald Monin
*Attorney, Agent, or Firm*—Townsend and Townsend and Crew LLP

[57] ABSTRACT

A method of fabricating a compositional semiconductor device comprising a quantum well wire or quantum dot superlattice structure, in particular a device selected from the group comprising lasers, photodiodes, resonant tunneling transistors, resonant tunneling diodes, far infrared detectors, far infrared emitters, high electron mobility transistors, solar cells, optical modulators, optically bistable devices and bipolar transistors, by epitaxial growth of the superlattice structure on a semiconductor substrate, is characterised in that the epitaxial growth is effected on a {311}, {211}, {111} or {110} substrate, and that the devices preferably have length and width dimensions less than 500 Å and especially less than 300 Å.

29 Claims, 14 Drawing Sheets

| Orientation | (100) | (211) | (311) | (111) |
|---|---|---|---|---|
| Height of the surface corrugation in Å. | 0 | 2.3 | 10.2 | 13.1 |
| Red-shift of the PL in meV. | 0 | 16 | 24 | 38 |
| lh-exciton continuum energy in meV. | 15 | 27 | 29 | 36 |

Fig. 10 photodiode
solar cell resonant tunneling
transistor far infrared emitter
far infrared detector

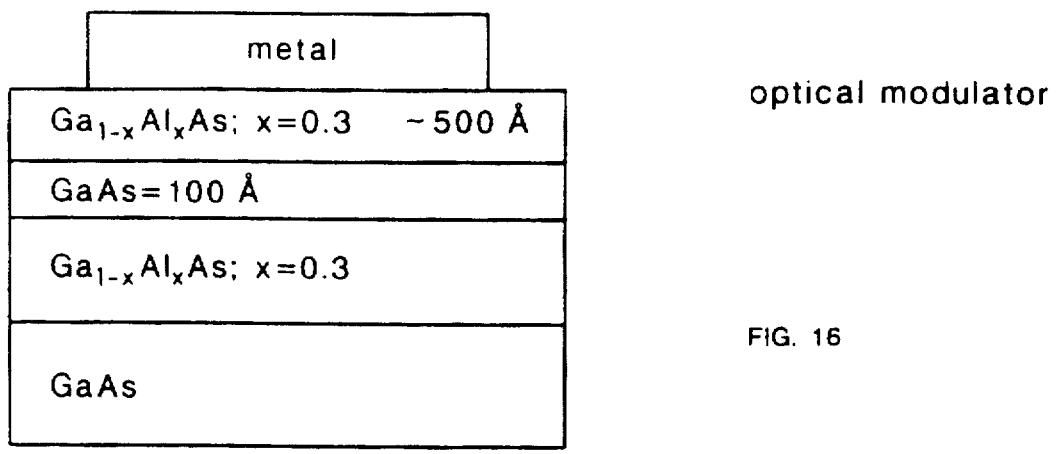
FIG. 16  optical modulator
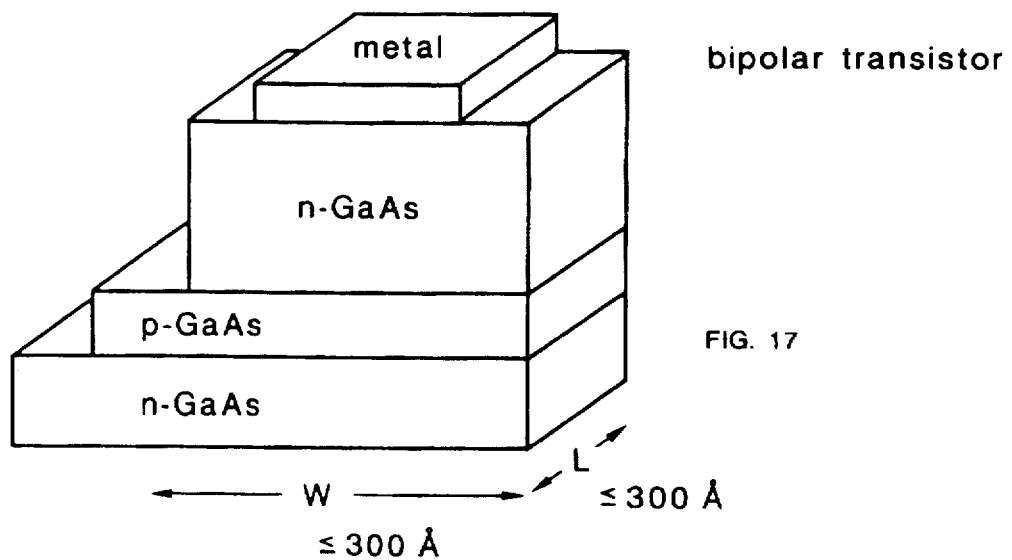
FIG. 17  bipolar transistor
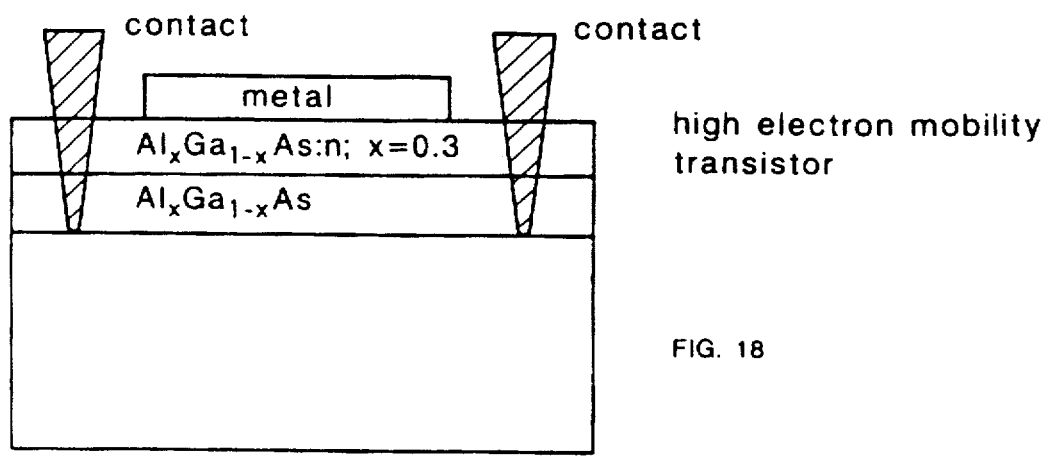
FIG. 18  high electron mobility transistor

METHOD OF FABRICATING A COMPOSITIONAL SEMICONDUCTOR DEVICE

This is a Continuation of application Ser. No. 07/826,597, filed Jan. 27, 1992, now abandoned.

The present invention relates to a method of fabricating a compositional semiconductor device comprising quantum well wire (QWW) or quantum dot (QD) superlattice structures and to compositional semiconductor devices fabricated in accordance with this method. The method is applicable to a wide range of different devices and can for example be used to fabricate QWW lasers, QWW photodiodes, QWW resonant tunnelling transistors, QWW far infrared detectors, QWW far infrared emitters, QWW high electron mobility transistors, QWW solar cells, QWW optical modulators, QWW optical bistability devices, and QWW bipolar transistors. It can also be used for QD lasers, QD photodiodes, QD resonant tunnelling transistors, QD far infrared detectors, QD infrared transmitters, QD solar cells, QD optical modulators, QD optical bistability devices, and QD resonant tunnelling diodes.

There is considerable scientific interest in such QWW and QD superlattice devices and the expected properties will undoubtedly lead to substantial future commercial interest. The study of nanometer scale phenomena in such semiconductors is for example discussed in:

J. S. Weiner et al, Phys. Rev. Letts. 63,1641(1989);

E. Kapon et al, Phys.Rev.Letts. 63,430(1989);

Y. Arakawa and H. Sakaki, Appl.Phys. Letts. 40,939 (1982);

M. A. Reed et al, Phys.Rev.Letts. 60,535(1988);

J. M. Hong et al, J.Cryst.Growth 95,266(1989);

M. Kohl et al, Phys.Rev.Letts. 63,2124(1989); and

M. L. Roukes et al, Phys.Rev.Letts. 59,3011(1987).

The fabrication of QWW and QD superlattice structures has however proved problematic. The most important prerequisite for experimental investigations is the precise fabrication of nanostructure semiconductors. The widely used method of patterning quasi-two-dimensional (2D) heterostructures with nanoscale lithographic techniques introduces defects which often dominate the electronic properties at small dimensions. For quantum wire structures, several direct-fabrication methods based on epitaxial growth have been exploited to reduce the defect densities, including growth of tilted superlattices on vicinal substrates which is discussed in: M. Tsuchiya et al, Phys.Rev.Letts. 62,466 (1989); T. Fukui and H. Saito, Jpn.J.Appl.Phys. 29,L731 (1990) and M. Tsuchiya et al, Appl.Phys.Letts. 54,1690 (1989), growth on supersteps created by etching discussed in E. Colas et al, Appl.Phys.Letts. 55,867(1989) and strain induced growth discussed in D. Gershoni et al, Phys.Rev.Letts. 85,1631(1990). Although the growth of tilted superlattices by deposition of fractional monolayers of alternating composition on stepped surfaces created by a small misorientation from singular surfaces is considered to be most promising, its successful application has so far been very limited. Apparently the continuous formation of well arranged steps is difficult due to poor control of local misorientation and kink formation, see T.Fukui and H. Saito, Jpn.J.Appl.Phys. 29,L731(1990). Also for supersteps it is difficult to control their height, uniformity and growth rate.

The principal object underlying the present invention is to provide a new method for the direct synthesis of QWW or QD superlattice structures which overcomes the difficulties outlined above, which is relatively simple to implement using existing epitaxial growth systems, in particular molecular beam epitaxy, and which results in high quality structures relatively free of defects.

To satisfy this object the present invention is characterised methodwise in that the epitaxial growth is effected on a $\{311\}$, $\{211\}$, $\{111\}$ or $\{110\}$ substrate.

This method is based on the recognition made for the first time by the present inventors in this application that growth on substrates with these orientations leads to the direct formation of quantum well wires or quantum well dots resulting from the in-situ formation of an array of macrosteps or facets with a periodicity defined by equilibrium rather than kinematic parameters. This kind of macrosteps can be realised on high-index planes having high surface energy. Equilibrium is achieved by breaking up the surface into facets corresponding to planes with lower surface energy. In this way macrosteps of the desired distance and height are obtained in a reproducible manner. This has been shown by reflection high energy electron diffraction and it is these steps which e.g. result in distinct energy shifts of the luminescence of GaAs/AlAs multilayer structures. It has been found that the surface structures give rise to lateral quantum-size effects which result in increased exciton binding energies, in strong exciton-phonon interaction and in pronounced optical anisotropy. In the prior art the optical properties of (Al,Ga)As heterostructures and quantum wells grown on substrates with non-(100) crystallographic orientations have been studied extensively, see T. Hayakawa et al, Phys.Rev.Letts. 60,349(1988); L. W. Molenkamp et al, Phys.Rev.B 38,4314(1988); Y. Khalifi et al, Phys.Rev.B 39,13533(1989) and S. Subbanna et al, J.Appl.Phys. 59,488 (1986). Compared with (100) oriented samples distinct red shifts of the luminescence, enhanced optical transitions, increased exciton binding energies and reduced laser threshold current densities were observed and often attributed to the anisotropy of the bulk GaAs heavy-hole band as described in L. W. Molenkamp et al, Phys.Rev.B 38,4314 (1988); T. Hayakawa et al, Phys.Rev.B 38,1526(1988) and T. Hayakawa et al, Jpn.J.Appl.Phys. 27,L300(1988). It has been shown, however, that the valence band dispersion cannot account for all these results in a clear manner. The enhanced exciton binding energy observed for (111)-oriented structures requires an increased in-plane heavy-hole mass, which cannot be theoretically justified as discussed in L. W. Molenkamp et al, Phys.Rev.B 38,6147 (1988) and W. Batty et al, Semicond.Sci.Technol. 4,904 (1989). However, these previous attempts to understand the specific optical properties of non-(100) oriented structures were based on the assumption of flat interfaces. The present inventors have however now shown that the actual situation is quite different. The interfaces are found to be periodically corrugated during epitaxy and the unique electronic properties can be understood in terms of additional lateral quantum-size effects.

As will be shown in the following the present inventors have demonstrated the existence of highly ordered surface and interface structures GaAs substrates with different crystallographic orientations. Under typical molecular-beam epitaxial (MBE) growth conditions for $Al_xGa_{1-x}As$, continuous arrays of nanometer-scale macrosteps or facets are formed, due to the breaking up of a flat surface with high surface energy into facets forming a periodically corrugated surface with a lower surface energy, see D. J. Chadi, Phys.Rev.B 29,785(1984) and C. Messmer and J. C. Bilello, J.Appl.Phys. 52,4623(1981). Studies we have conducted using reflection high energy electron diffraction (RHEED) directly reveals the formation of asymmetric pyramids on the (211)

surface, periodic channels on the (311) surface, and symmetric pyramids on the (111) surface. The red shift of the luminescence of GaAs/AlAs multilayer structures and the enhancement of the exciton binding energies are correlated with the height of the surface corrugation. The increased exciton binding energies directly indicate additional lateral confinement, which is further evidenced by a strong exciton-phonon interaction and a pronounced optical anisotropy for the (211) and (311) oriented structures. Hence, the observed surface and interface ordering offers a unified picture to explain previously not well understood results. In addition, this ordering provides a unique method to directly synthesise quantum-dot and quantum-wire structures.

A particularly important aspect of the method of the present invention is that the length and/or width of the individual semiconductor devices are restricted to less than 500 Å in particular to 300 Å or less.

These small dimensions which are substantially smaller than those of previously known devices are only possible once the teaching of the present application has been understood.

This important concept of the present invention is based on the appreciation that the surface structure of the devices grown on the abovementioned substrates brings about a localisation of the charge carriers so that the charge carriers are trapped at room temperature and cannot readily diffuse to the boundary surfaces and edges and recombine there. The advantage is that the total current can be thereby reduced. The current density in terms of $mA/cm^2$ will remain approximately the same, the total current will however be strongly reduced. The laser threshold or threshold current will likewise be very greatly reduced, whereas the light yield will be increased. These advantages are obtained by the reduction in the size of the structures which is made possible by the recognition, in accordance with the present invention, that growth on substrates with the orientations specified in claim 1 results in high quality profiled surfaces at the layer interfaces and thus the desired quantum confinement of charge carriers.

Initial investigations relating to the present invention were carried out to realise the direct synthesis of GaAs quantum wire structures on (311)A oriented substrates by molecular beam epitaxy (MBE). The orientation exhibits excellent growth morphology as well as a high surface energy. Reflection high energy electron diffraction (RHEED) measurements directly reveal the formation of a stepped surface during epitaxial growth, having a lateral periodicity of 32 Å and a step height of 10.2 Å. The existence of these macrosteps is confirmed by distinct energy shifts in the exciton resonances of periodic GaAs/AlAs multilayer structures. That is to say that the formation of GaAs quantum wire-structures on the (311) substrate is confirmed by the strong polarization anisotropy of the excitonic transitions in undoped QWW SL and by the strong anisotropy of the conductivity in modulation-doped heterostructures. Also connected with the additional lateral confinement is the appearance of intense phonon related lines in the photoluminescence (PLL) and photoluminescence excitation d(PLE) spectra. From the peak energies of the phonon lines in the PLE spectra the 1D confinement energy is estimated to reach a value as high as 90 meV for a 43 Å GaAs QWW SL. The strong polarization dependence of the luminescence persists even at room temperature. A striking result of the investigations to date has been the extremely high integrated luminescence of the new periodic GaAs/AlAs multilayer structures, i.e. of the QWW SL which does not degrade with temperature up to as high as 400 K. This finding is important for application of these GaAs quantum wire structures in light emitting devices of high efficiency.

Although investigations of {311} substrates to date have involved growth on (311)A GaAs substrates it is to be assumed from the underlying theoretical considerations that any one of the set of {311} surfaces will produce equivalent results. All crystal directions, surfaces and equivalent surfaces are described herein using the internationally accepted notation known as Miller Indices.

The growth method proposed herein on (311) substrates results in channels oriented along [−2,3,3] directions thus forming an as-grown quantum well wire superlattice. The method is applicable to semiconductor devices realised in any one of the III–V, or II–VI or IV material systems.

Figure 2A:
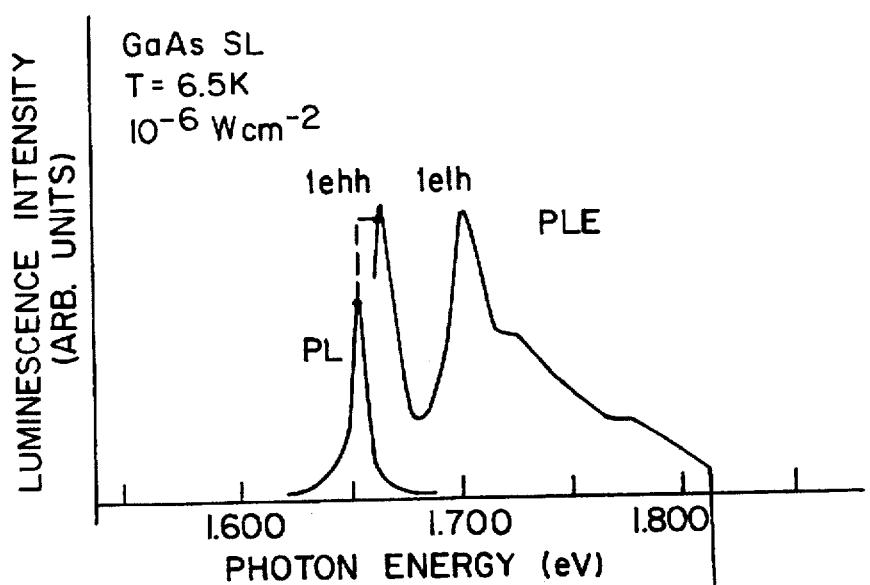

As an example of the III–V material system investigations have in particular been made of GaAs/AlAs. With AlAs GaAs superlattices a particular problem exists with laser and light generating devices in that the number of radiative transmissions in the GaAs are reduced because the electrons move into the lower lying energy levels of AlAs layers and lead to non-radiative transitions there. This problem of non-radiative transitions is discussed in the Journal of Applied Physics, vol. 52, No. 2, Feb. 1981 on page 625 in the right hand column. The transitions themselves are illustrated in FIG. 2a of the Article "Optical, vibrational and structural properties of staggered alignment (Type II) GaAs/AlAs and ternary alloy $Al_xGa_{1-x}As/AlAs$ multiple quantum wells" by Cingolani, Ploog, Scamarcio and Tapfer, published in Optical and Quantum Electronics 22 (1990), pages 201 to 230.

The present invention foresees, that by growing the superlattice on a {311} substrate, or indeed on a substrate having one of the orientations described in claim 1, the very high quality of the boundary surfaces which are achieved, which now arise through equilibrium considerations rather than through kinetic parameters, will lead to the transitions of the charge carriers from the AlAs energy levels becoming radiative transitions so that a pronounced high light yield can be obtained.

The realisation of QWW and QD structures in SiGe compositional superlattices, i.e. a class IV system, is also of particular interest, not least because the technology required to fabricate semiconductors in these materials is well established.

With respect to a material system of this kind grown preferably on a {311} substrate (or alternatively on any of the other substrates defined in claim 1) a device in accordance with the present invention preferably comprises a superlattice structure in its active region, with the superlattice structure comprising an alternating arrangement of Si and Ge layers with each layer having a thickness corresponding to a few monolayers, in particular a number of monolayers in the range from 1 to 18, the superlattice comprising more particularly an alternating structure of six monolayers of silicon and four monolayers of germanium.

It is known from an Article by Zachai et al entitled "Photoluminescence in short period Si/Ge strained layer superlattices published in Physical Review Letters, vol. 64, No. 9, Feb. 26th, 1990 pages 1055 to 1058 that a binary SiGe superlattice comprising an alternating structure with six Si monolayers followed by four Ge monolayers leads—with the strained layer superlattice—to pronounced photoluminescence at low temperatures at a wavelength of 0.85 eV. The inventors propose that by fabricating superlattice structures of just a few monolayers thickness, and in particular comprising alternating interleaved Si and Ge layers of six and four monolayers thickness respectively, it is possible by growth on a {311} substrate (or any other substrate defined in claim 1) to produce pronounced photoluminescence even at room temperature and this would be very favourable for the use of such photoluminescent devices in optical transmission systems.

It should also be particularly favourable that photoluminescent devices of this kind could then be operated with optical amplifiers, particularly the rare earth doped optical fibers described in Scientific American, March 1991, pages 80 to 82. The Erbium doped optical amplifiers described in the named scientific American article would be particularly suitable for use with photoluminescent devices as described herein.

The present invention also includes compositional semiconductor devices fabricated in accordance with the above method and as described in claims 8 to 11.

It should be noted that the basic layer sequences for the structures named at the beginning of this specification are known per se, typically for growth on {100} substrates. The present invention proposes the growth of these structures on {311}, {211}, {111} or {110} substrates, in particular with special dimensional constraints, to realize novel QWW and QD structures.

This invention will now be described in further detail with reference to specific embodiments and the accompanying drawings in which:

FIG. 1(a) shows a schematic representation of the stepped substrate surface resulting from growth on a (311) GaAs substrate, the upper surfaces give an idea on the development during growth after deposition of the first monolayer, (b) the reciprocal lattice of the stepped surface, (c–e) reflection high energy electron diffraction (RHEED) intensity profiles measured as a function of the scattering vectors $k_{//}$ and $k_\perp$, respectively as indicated in (b).

FIG. 2(a) shows photoluminescence (PL) and PL excitation (PLE) spectra of a conventional (100) oriented superlattice (SL) with an excitation wavelength of 600 nm, (b) PL and PLE spectra of the (311) oriented quantum well wire superlattice (QWW SL) under experimental conditions the same as for FIG. 2(a), however the vertical scales are different for the PL- and PLE spectra and the PLE spectra are shifted for clarity.

Figure 3:
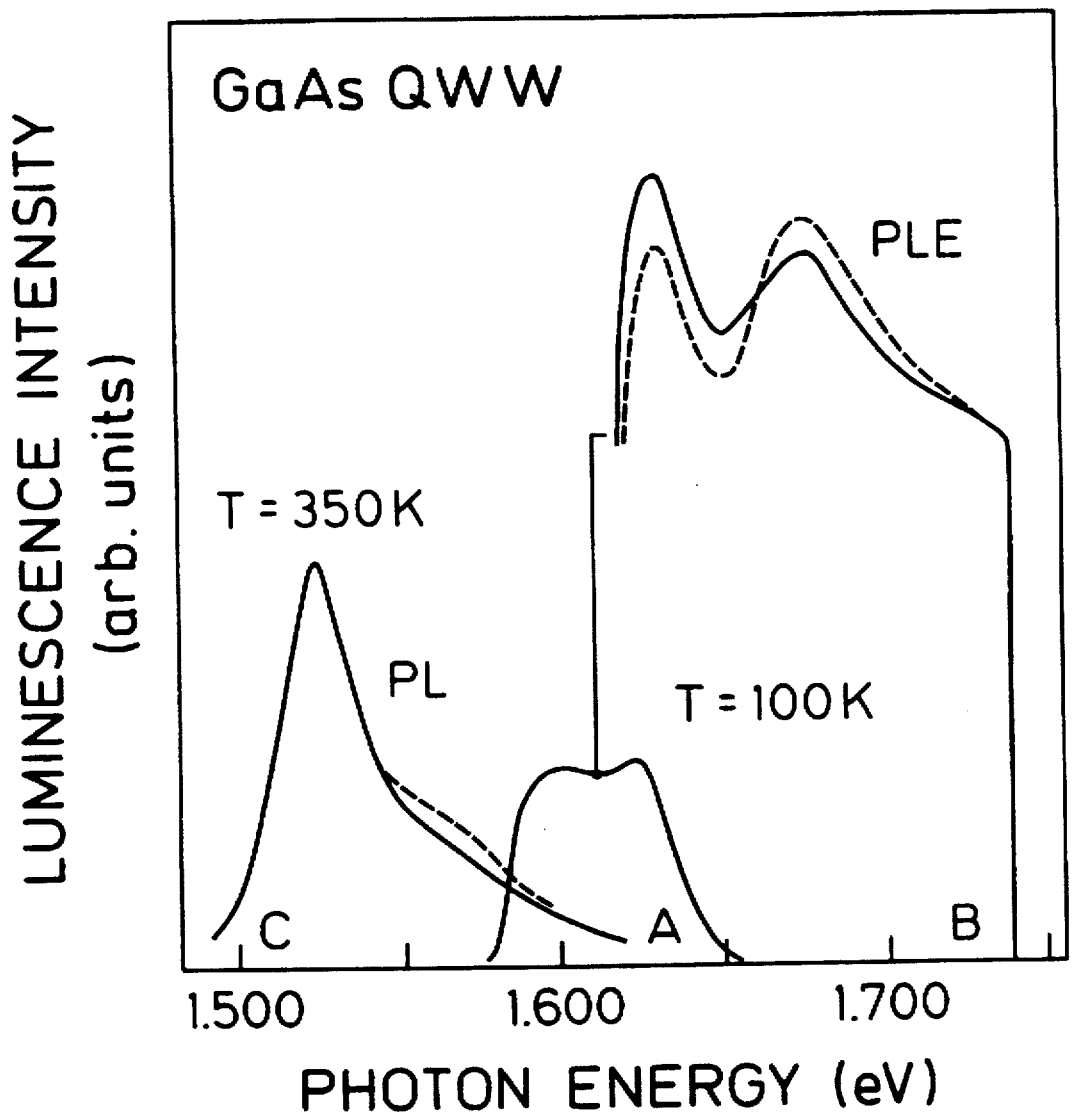
Figure 4:
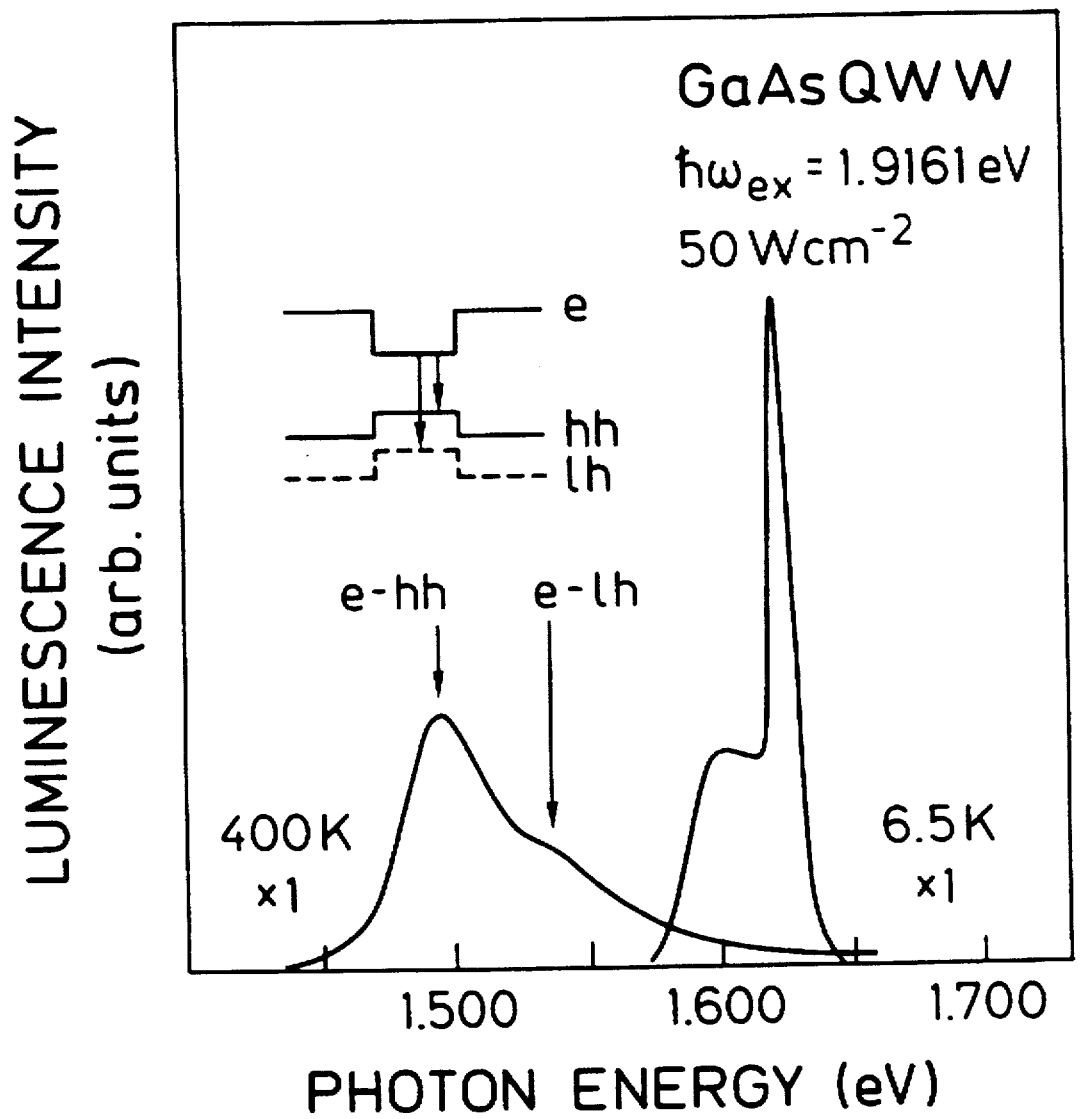
Figure 5:
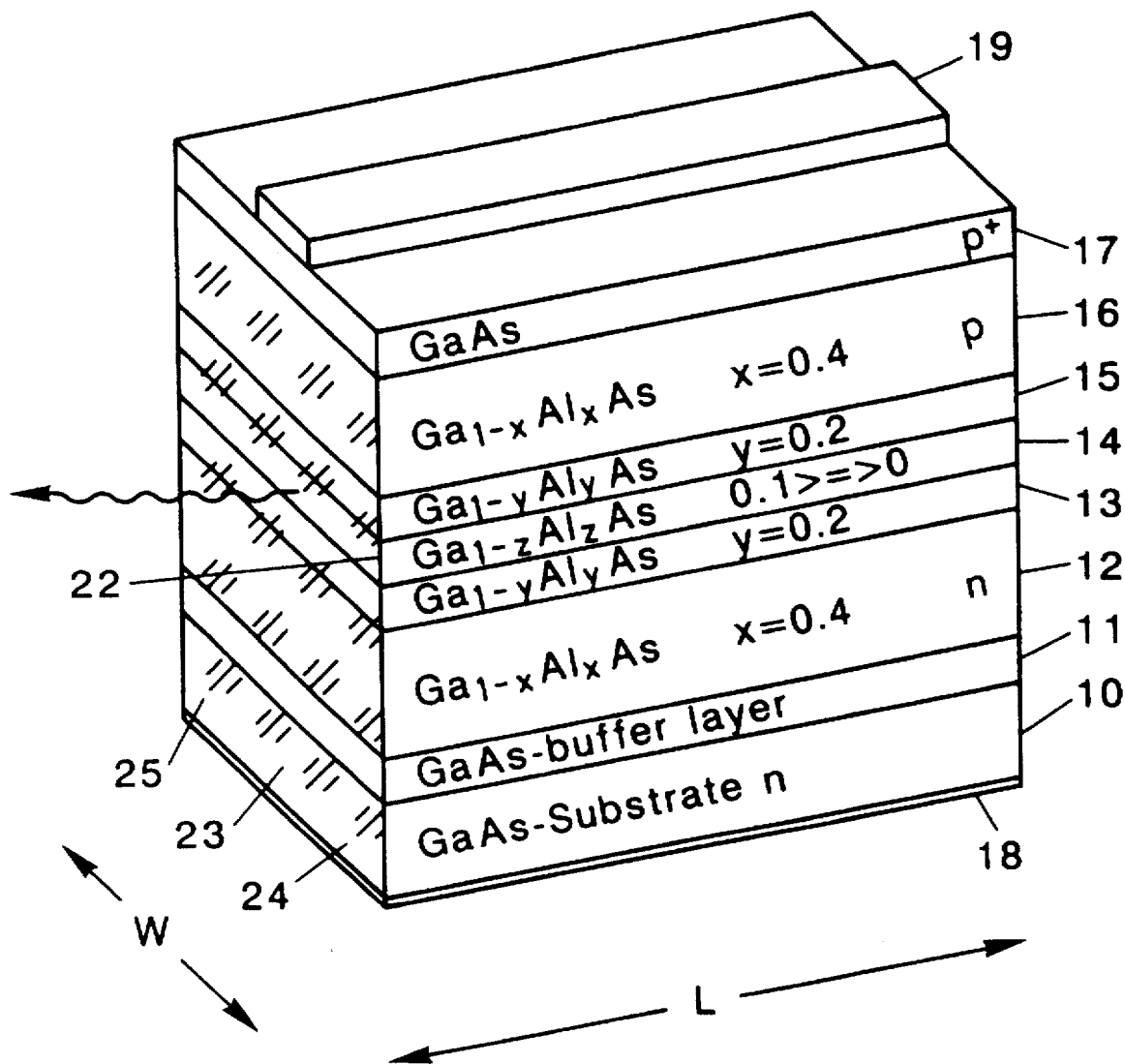

FIG. 3 shows (A,C) photoluminescence (PL) and (B) PL excitation (PLE) spectra of the quantum well wire (QWW) superlattice for the following excitation densities and wavelengths: (A) $10^{-6}$ Wcm$^{-2}$, 600 nm, (B) 20 Wcm$^{-2}$, 476.2 nm, and (C) $10^{-6}$ Wcm$^{-2}$, 600 nm. For (B,C) the solid line corresponds to light polarized in the direction parallel to the wires and the dashed line shows the change in the spectra for the light polarized in the direction perpendicular to the wires. The vertical scales for A, B and C are different. For C the peaks are normalised to the heavy hole exciton for clarity, FIG. 4 shows photoluminescence spectra of the quantum well wire (QWW) superlattice of the present invention. The scales are the same as in FIG. 3 and the schematic energy diagram is shown in the insert, FIG. 5 shows a schematic representation of the semiconductor layers of a known type of semiconductor laser but which is however grown in accordance with the present invention on a (311) substrate.

Figure 6:
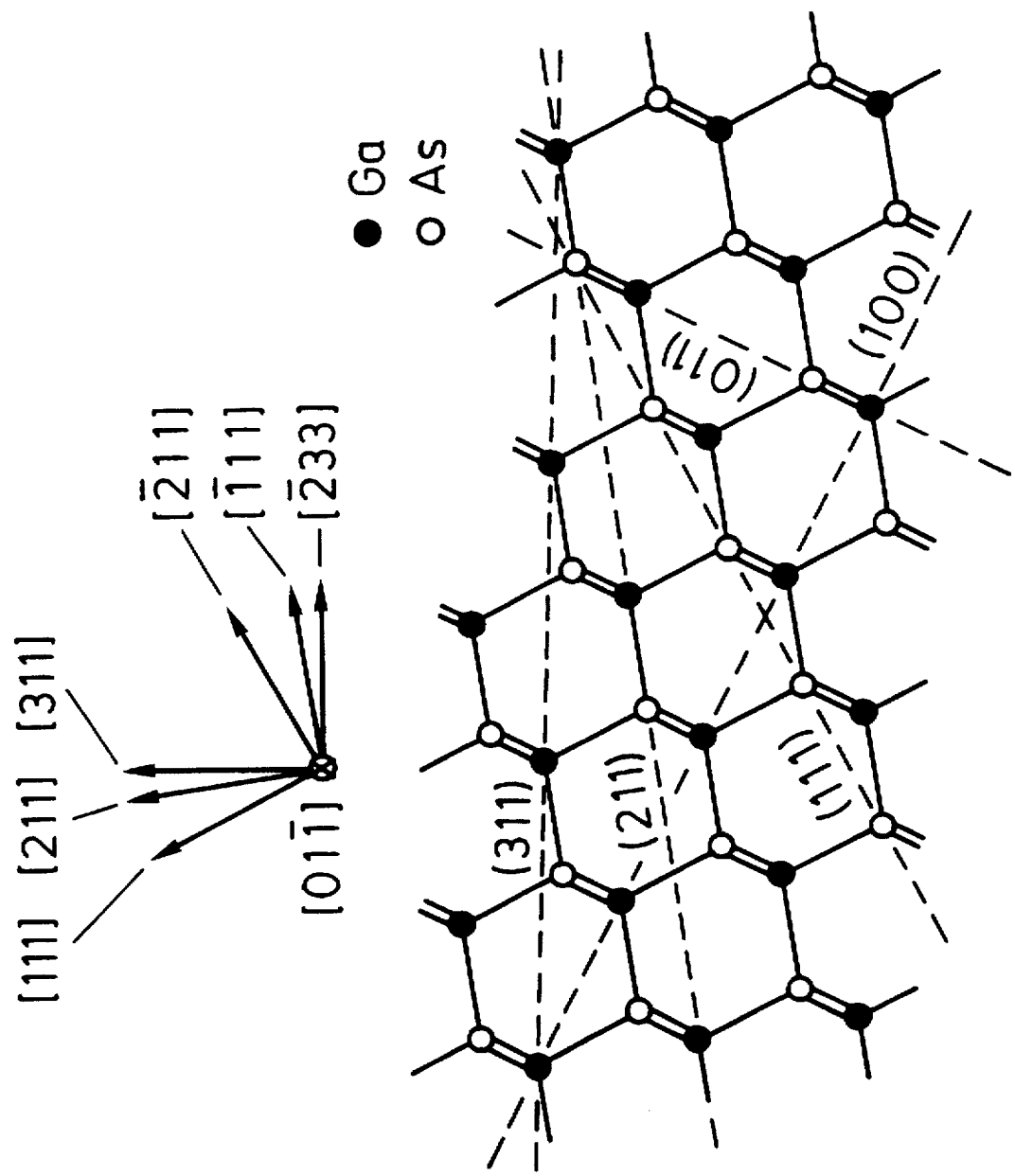
Figure 7A:
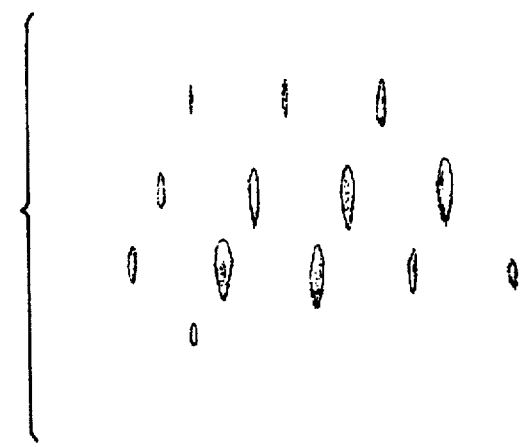
Figure 7B:
Figure 7C:
Figure 7C:
Figure 7D:
Figure 8A:
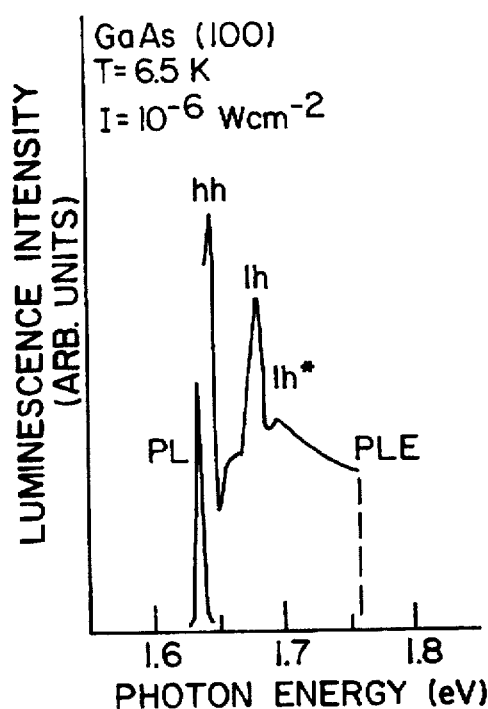
Figure 8C:
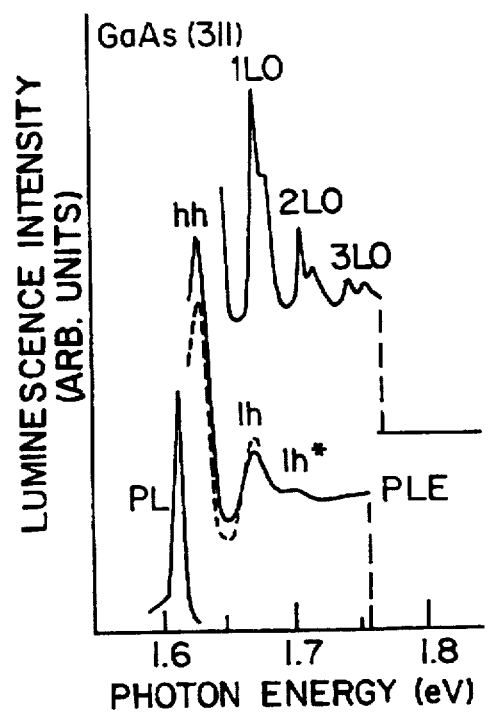
Figure 8B:
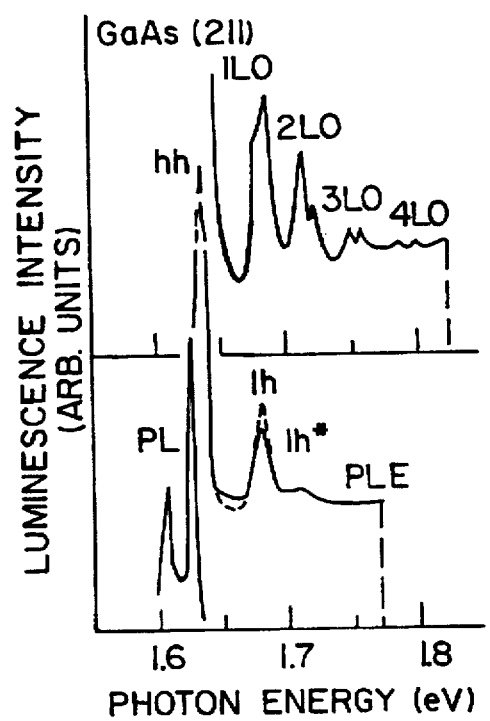
Figure 8D:
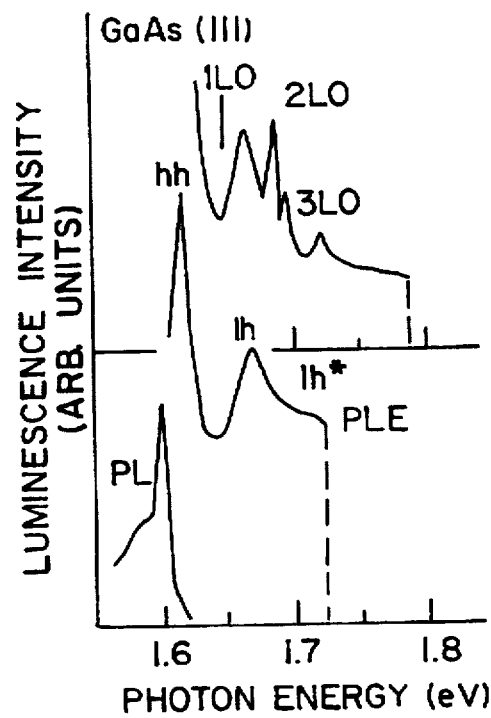

FIG. 6 cross-section of the host GaAs crystal viewed along [0,1,-1]. The (211), (311), (111) and (100) planes are indicated, FIG. 7 reflection high energy electron diffraction patterns of the (211) GaAs surface (a) along the [0,1,-1] and (b) along the [-1,1,1] azimuth, and of the (311) GaAs surface (c) along the [0,1,-1] and (d) along the [-2,3,3] azimuth, FIG. 8(a) photoluminescence (PL) and PL excitation (PLE) spectra of the (a) (100), (b) (211), (c) (311), and (d) (111) GaAs/AlAs multilayer structures. For (b) and (c), the dashed lines show the PLE spectra for light polarized parallel to the [0,1,-1] azimuth (parallel to the direction of lateral quantization) and the solid lines correspond to the respective perpendicular directions. The sharp L0- and T0 phonon related lines are resolved with the detection wavelength set to the high energy side of the PL line. The different transitions are indicated, FIG. 9 photoluminescence (PL) and absorption spectra of the (111) GaAs/AlAs multilayer structure. The different transitions are indicated, FIG. 10 a table showing the dependence of the luminescence red shift and light-hole exciton binding energy on the height of the surface corrugation for various orientations, FIG. 11 a crystallographic model of the stepped surface of a QWW SL grown on a (311)-A GaAs surface, FIG. 12 a graph illustrating 4 terminal conductivities perpendicular and parallel to quantum wires grown on a (311)-A GaAs substrate as described herein, and FIGS. 13 to 18 illustrate, for the sake of completeness, the typical material layers and thicknesses of a photodiode (or solarcell), of a resonant tunneling transistor, of a far infrared emitter (or detector), of an optical modulator, of a bipolar transistor and of a high mobility electron transistor respectively.

In order to demonstrate the success of the present invention in producing quantum well wires a comparative study was carried out in which 50-period 56 Å GaAs/50 Å AlAs multilayer structures were grown by MBE simultaneously on (100) and (311) GaAs substrates, soldered side-by-side on a molybdenum block. The substrate temperature was 580° C., the growth rate was 1 μm/h for both GaAs and AlAs and the As$_4$/Ga flux ratio was 5. The samples were grown in a RIBER 2300 MBE growth chamber. Growth on (311) GaAs was monitored by RHEED using a 30 keV electron beam from a RIBER CER-1050 electron gun at 1° glancing angle. The measurement system consisted of video camera, video recorder, and image processing system (VG AUTOLEED). The structural parameters of the samples were determined with a computer-controlled high-resolution double-crystal x-ray diffractometer in Bragg-geometry. A rotating-anode 12-kW generator with a copper target $\lambda_{CuK\alpha1}$=0.1540562 nm) was employed as x-ray source, and an asymmetrically cut (100) Ge crystal served as monochromator and collimator. Photoluminescence (PL) and photoluminescence excitation (PLE) measurements were performed at different excitation densities, polarizations, and sample temperatures.

Figure 1B:
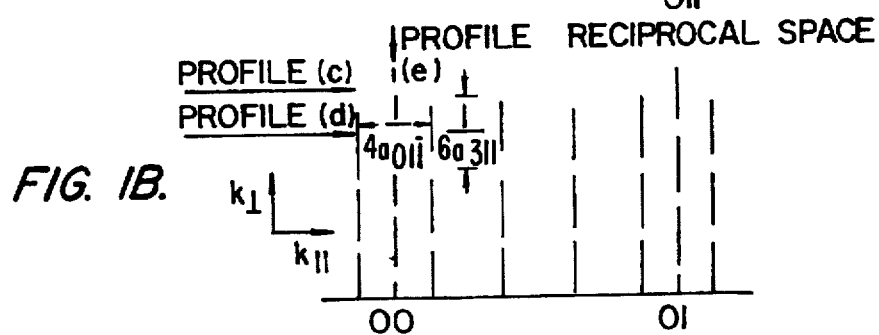
Figure 1C:
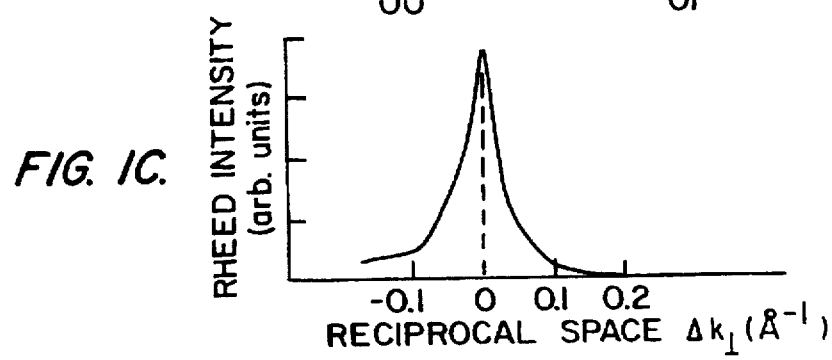
Figure 1D:
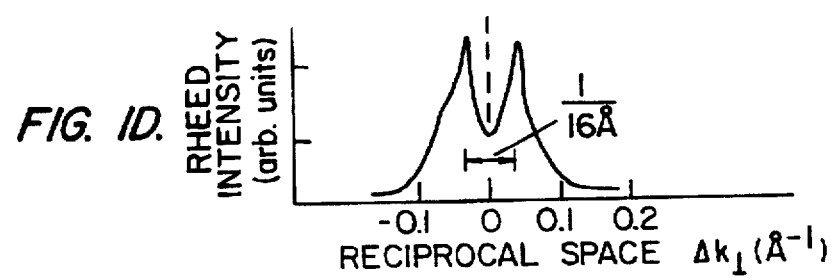
Figure 1E:
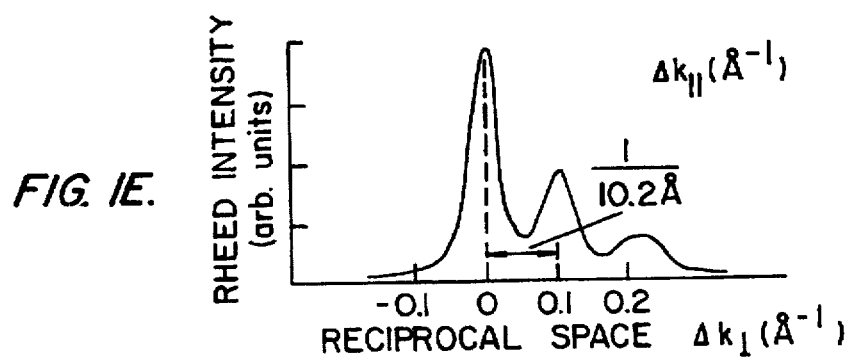

After oxide removal at 580° C. the RHEED patterns of the (311) surface recorded along different azimuthal directions revealed an ordered array of upward and downward steps oriented along the [-2,3,3] direction as seen in FIG. 1(a). With the electron beam along the [0,1,-1] direction the diffraction pattern shows a pronounced streaking indicating a high density of steps along the perpendicular [-2,3,3] direction. Observing the [-2,3,3] azimuth parallel to the steps, the streaks are found to be alternatingly split into sharp satellites or unsplit in dependence on the scattering vector $k_\perp$. This RHEED pattern gives a direct image of the reciprocal lattice of the stepped surface as shown in FIG. 1b. Intensity profiles measured as a function of $k_{//}$ for different $k_\perp$ values and as a function of $k_\perp$ as indicated in FIG. 1b are presented in FIGS. 1c to e. The scale is taken from the separation of the zero and first order diffraction streaks of the (100) GaAs sample in the [0,1,-1] azimuth. The separation of the satellites in FIG. 1d gives the lateral periodicity of 32 Å (8×$a_{110}$) for the stepped surface. The cancellation of the main streak intensity in this profile in comparison to the profile in FIG. 1c evidences the high degree of ordering. From the splitting in the profile measured along the streaks as shown in FIG. 1e the step height is found to be 10.2 Å. These values confirm the assumed model of the crystal structure describing the surface as composed of (311) terraces of 4 Å width (1×$a_{110}$) and two sets of (3,3,-1) and (-3,1,-3) facets corresponding to upward and downward steps of 10.2 Å height (6×$a_{311}$). In agreement with surface energy considerations, the nominal (311) surface breaks up into (3,3,-1) and (-3,1,-3) facets of lower energy.

Inspection of the RHEED intensity dynamics reveals a pronounced oscillation at the onset of GaAs and AlAs growth, respectively, corresponding to the deposition of three (311) monolayers. During the next three monolayer deposition, the intensity approaches a value corresponding to the stable stepped surface. This behavior is interpreted as a phase change of the surface corrugation during the deposition of the first monolayers of GaAs on AlAs and vice versa, as indicated in FIG. 1a. This phase change is induced by strain which plays an important role here and makes the heterogenous growth on the facets energetically less favorable. As a consequence, the complete structure consists of GaAs/AlAs superlattice (SL) regions containing well-ordered channels of GaAs and AlAs thicker and thinner than the wells and barriers of the SL, respectively. These channels are oriented along [-2,3,3] and they indeed form an as-grown quantum well wire (QWW) SL. The existence of this QWW SL has been confirmed by high-resolution transmission electron microscopy which shows a modulation of the boundary surface and thicker and thinner regions.

The periodic GaAs/AlAs multilayer structures of the present study exhibit excellent structural perfection on both the (100) and (311) substrate, as derived from the width and intensity of the x-ray diffraction peaks. The GaAs well width of $L_z$=56 Å measured by x-ray diffration is confirmed for the (100) orientation by the energy of the heavy-and light-hole exciton (1 ehh at 1.665 eV and 1 elh at 1.700 eV) observed in the PLE spectrum of FIG. 2(a). The intensities of the 1 ehh and 1 elh resonances of this (100) SL do not depend on the polarization of the incident light.

Figure 2B:
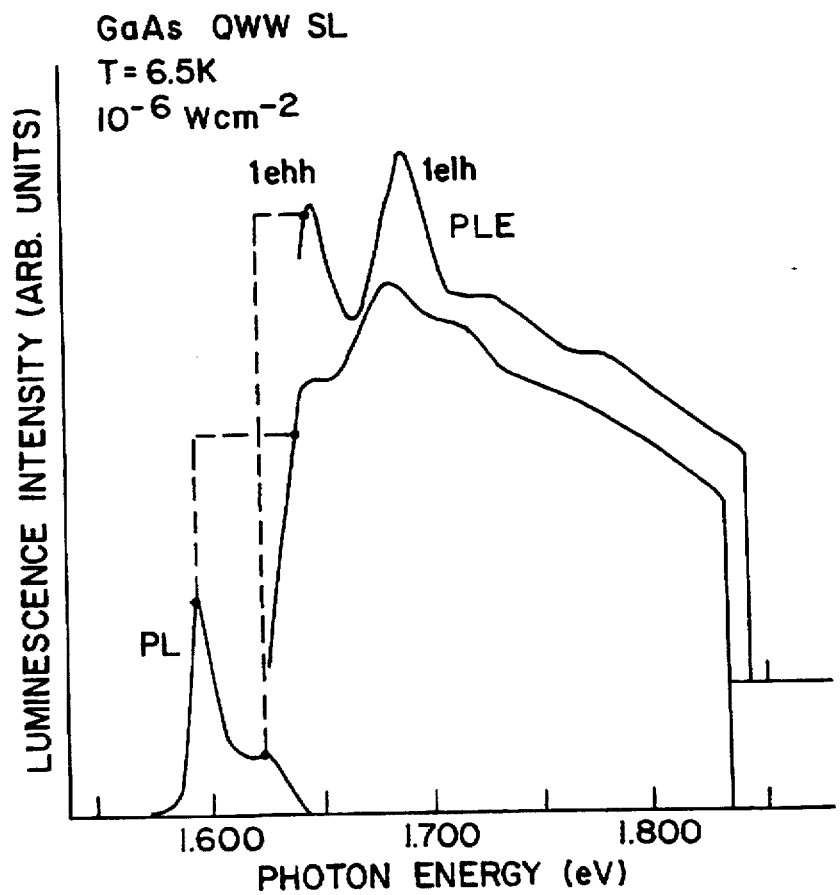

On the contrary, the (311) sample, although of comparable structural perfection and having the same average well width, exhibits a distinct low energy shift of the luminescence which is additionally split into two lines (FIG. 2b). The peak energies at 1.604 eV and 1.631 eV do not shift with excitation density. However, the 1.604 eV line having a sharp low-energy onset saturates with enhanced excitation density and is thus assumed to be due to localised states. These two luminescence lines most probably arise from transitions in the QWW regions formed by the macrosteps on the (311) surface (see FIG. 1a for illustration). Monitoring PLE at these two lines reveals two distinct features due to 1 ehh and 1 elh excitons of the QWW regions, whereby the small energy shift is again due to localised states. The one-dimensional (1D) character of the resonances is confirmed by the strong polarization dependence which persists up to high temperatures. In FIG. 3 we show that with light polarized with its electric field perpendicular to the QWW (p polarization) the intensity of the light-hole exciton peak drastically increases with respect to the case when the light is polarized parallel to the QWW (s polarization), where the heavy hole exciton is more intense. This optical anisotropy is expected from theory for 1D structures, and it was recently also observed for QWW arrays prepared by deep mesa etching. The corresponding polarization behavior is also observed in the luminescence spectra and even at high temperatures (see spectra C in FIG. 3 for p and s polarization at 350 K).

FIG. 4 shows the PL spectra of the QWW SL at 6.5 K and 400 K. At 6.5 K, the integral luminescence intensity of the QWW SL is comparable to the (100) SL sample. However, in contrast to the (100) SL sample, the intensity of the QWW SL does not change with temperature up to 400 K (maximum temperature of the measurement) even at moderate excitation densities. This again demonstrates the 1D character of the QWW SL grown on (311)A substrates where the optical gain is expected to be strongly enhanced. This is one of the most essential features of the present QWW structures having an energy level spacing larger than the thermal energy, making them important for optical applications especially for QWW lasers.

In summary, the invention provides a method for the direct synthesis of semiconductor quantum well wire structures on high index substrates. Due to its high surface energy the (311) surface breaks up into regular facets having nanometer scale dimensions, which can be directly monitored by RHEED during epitaxial growth. In addition, RHEED dynamics evidences a unique growth mechanism on the stepped surface. Thicker and thinner regions of GaAs and AlAs are built up forming the QWW SL, which was confirmed by distinct energy shifts in the exciton resonances. The 1D character of the QWW SL was reflected in a strong polarization anisotropy of the PL and PLE spectra persisting up to high temperatures. The observed extremely high integrated luminescence intensity, which does not degrade up to 400K, leads to the conclusion that the QWW SL is nearly perfect with only a small degree of disorder.

As indicated above the present invention is applicable to many known compositional semiconductor devices with superlattice structures, it only being necessary to grow the devices on a substrate with a {311} surface in order to realise a quantum well structure in the form of well defined quantum well wires. As an example reference can be made to FIG. 5 which shows a semiconductor laser device fabricated in accordance with the present invention.

The semiconductor laser device of FIG. 5 comprises a (311) GaAs n-type substrate 10 onto which there is first grown a GaAs buffer layer 11 of 0.1 microns to 0.5 microns thickness. This buffer layer ensures a regular crystallographic structure. A layer 12 of $Ga_{1-x}Al_xAs$ of n-type material with x typically equal to 0.4 and a thickness of typically 1μ is grown onto the buffer layer 11. This layer 12 is followed by a further layer 13 of $Ga_{1-y}Al_yAs$ in which y is typically equal to 0.2. Layer 13 has a thickness of approximately 60 Å (or less) and is followed by a further layer 14 of $Ga_{1-z}Al_zAs$ with z between 0.1 and 0 and a layer thickness of less than 60 Å (or less). This ultra-thin layer 14 is followed by a further ultra-thin layer 15 of the same composition and thickness as the layer 13, i.e. a layer of $Ga_{1-y}Al_yAs$ with y approximately equal to 0.2 and a layer thickness of 60 Å (or less). These three ultra-thin layers, which have a thickness such that size quantization occurs, are then followed by a layer 16 of p-type material which is again $Ga_{1-x}Al_xAs$ with x approximately equal to 0.4. This layer 16 of p-type material has a thickness of approximately 1μ and is followed by a thinner layer of GaAs (thickness 0.1μ to 0.5μ) which is doped so that it is a high $p^+$ material (impurity concentration greater than $10^{18}$).

This semiconductor device is provided with first contact means 18 applied to a basal layer of the device, i.e. to the substrate 10. Second contact means is provided on an upper layer of the device, namely the GaAs layer 17 and takes the form of a strip-like contact 19. The strip-like contact 19 overlies a lasing region 21 of the device. The end face 24 of the device is provided with a partially reflective coating illustrated by the shading 25. The device has a length L and a width W of the order of magnitude of μm less than 500 Å. More particularly in the illustrated embodiment L=500 μm and W=200 Å. It should be noted that for a laser structure the confinement advantages are obtained by keeping the width of the structure narrow. The length should however have dimensions in the μ-range, preferably of several hundred μm in order to ensure adequately high gain. With other devices it can be of advantage to reduce L to below 500 Å and indeed preferably to below 300 Å.

A further series of experiments will now be described which show that the invention can also be realised and practised by growing the listed devices on {211} and {111} substrates. The discussion also includes further work relating to growth on {311} substrates.

The MBE-growth on (211), (311) and (111) oriented GaAs substrates was monitored by RHEED using a 30 keV electron beam at 1° glancing angle, 70-period 46 Å GaAs/41 Å AlAs multilayer structures were grown side by side on a Mo-block with a (100)-GaAs substrate as reference. The substrate temperature was 630° C., and the growth rate was 1 μm/h for GaAs and 0.5μ/h for AlAs. The structural parameters of the samples were determined by double-crystal-x-ray diffraction. Photoluminescence (PL) and photoluminescence excitation (PLE) measurements were performed with the samples mounted in an optical He-flow cryostat. Light from a broadband halogen lamp dispersed by a monochromator, served as excitation source.

After the oxide removal at 580° C., the RHEED-patterns of the (211), (311), and (111) surfaces were recorded along different azimuthal directions. In order to give an idea of the geometrical situation, a cross-section of the host GaAs crystal viewed along the [0,1,-1] direction is shown in FIG. 6, with the investigated singular planes indicated. The RHEED pattern of the (211) surface shows a reversible faceting of the flat surface at temperatures above 590° C. The transition occurs continuously over a temperature range between 550° C. and 590° C. The observation of the [0,1,-1] azimuth (FIG. 7a) exhibits a stepped surface along [-1,1,1]. The methodology is described in the article by M. G. Lagally et al in the book "Reflection High-Energy Electron Diffraction and Reflecting Electron Imaging of Surfaces" edited by P. K. Larsen and P. J. Dobson, NATO ASI Series B, Plenum Publishing Corporation, New York and London, 1988) at p 139. The lateral periodicity of 9.5 Å is deduced from the streak separation and the step height of 3.6 Å from the tilt angle of the intensity maxima along neighbouring streaks together with the lateral periodicity. The RHEED pattern of the perpendicular [-1,1,1] azimuth (FIG. 7b) shows streaks tilted by 30° to the surface normal, indicating the presence of {110} facets. As a consequence, the surface comprises two sets of {110} facets along [-1,1,1] and alternating (111) terrace planes and (111) steps along [0,1,-1] forming asymmetric pyramids of 3.6 Å height (3* $d_{211}$).

The RHEED pattern of the (311) surface reveals a pronounced streaking with the electron beam along the [0,1,-1] direction (FIG. 7c) indicating a high density of steps along the perpendicular [-2,3,3] direction. Observing the [-2,3,3] azimuth parallel to the steps (FIG. 7d), the RHEED pattern images the reciprocal lattice of an almost perfect two level system which is oriented along [-2,3,3], see the article by M. G. Lagally et al in the book "Reflection High-Energy Electron Diffraction and Reflecting Electron Imaging of Surfaces" edited by P. K. Larsen and P. J. Dobson, NATO ASI Series B, Plenum Publishing Corporation, New York and London, 1988) at p 139. Contrary to the case of the (211) surface, the RHEED pattern of the stepped (311) surface is stable down to room temperature. The lateral periodicity of the stepped surface of 32 Å is determined from the splitting of the (00) streak into sharp satellites and the height of the steps of 10.2 Å from the splitting along its length. As a result, the (311) surface is composed of (311) terraces of 4 Å width (1* $a_{110}$) and two sets of {331} facets along [-2,3,3] corresponding to upward and downward steps of 10.2 Å height (6* $d_{311}$).

The RHEED pattern of the (111) surface shows a pronounced splitting along the (00) streak which corresponds to a surface corrugation of 13.1 Å height. The splitting is observed for arbitrary azimuthal directions and, hence, the surface is assumed to break up into symmetric pyramids of 13.1 Å height (4* $d_{111}$).

The MBE grown GaAs/AlAs multilayer samples have a high structural perfection comparable to that of the (100) reference sample, and have the same average GaAs and AlAs layer thicknesses, as determined from the width, intensity and separation of the x-ray diffraction peaks. The methodology is described in L. Tapfer and K. Ploog, Phys. Rev.B 33,5565(1986). The observed red shift of the PL peak, with respect to the (100) sample, increases with the height of the surface corrugation for the different orientations (FIG. 3 and Tab.1). The red shift is attributed to a heterogenous growth mode on the facets, similar to that observed on non-planar GaAs substrates, described in E. Kapon et al, Phys.Rev.Letts. 63,430(1989), which results in the formation of thicker and thinner GaAs (and AlAs) regions, upon the bottom and the top-level of the surface corrugation, respectively. The observed enhancement of the light-hole (lh) exciton binding energies, also correlates with the height of the surface corrugation as shown in the table of FIG. 10, indicating additional lateral confinement in the GaAs/AlAs multilayer structures, which is introduced by the corrugated interfaces. The lh exciton binding energies were determined from the energy separation of the lh- and the excited lh exciton states observed in the PLE spectra (FIG. 8). The lh-character of the transitions was proved by the measured negative degree of circular polarization, which excludes their origin from "forbidden" transitions. The basis for this proof is described in R. C. Miller and D. A. Kleinmann, J. Lumin. 30,520(1985). The enhanced exiton binding energies give rise to a larger exciton-phonon interaction (see S. Permogorov, Phys.Stat.Sol.(b)68,9(1975)) due to the increased probability of the excitons created above the bandgap relaxing as a whole. If the detection wavelength is set to the high-energy side of the PL line, strong LO and TA phonon related lines are resolved in the PLE spectra of the (311), (211), and (111) samples (FIG. 8).

The PLE spectra of the (211) and (311) samples (FIG. 8b,c) exhibit a pronounced polarization anisotropy of the excitonic resonances. The lh resonance is more pronounced in the spectrum taken with the light polarized parallel to the [0,1,-1] direction, whereas the heavy-hole (hh) resonance is more pronounced for the polarization perpendicular to [0,1,-1]. This behaviour shows the lateral quantization in the [0,1,-1] direction for both samples. The methodology is described in E. O. Kane, J.Phys.Chem.Solids 1,249(1957); U. Bockelman and G. Bastard, Europhys.Letts. 15,215 (1991) and D. S. Citrin and Y. C. Chang, Phys.Rev.B 43,11703(1991). The polarization anisotropy is more pronounced for the (311) sample compared to the (211) sample owing to the free motion of the carriers allowed along [−2,3,3] in agreement with the observed surface structure. The residual optical anisotropy of the (211) sample reflects the asymmetric surface structure with the relevant lateral quantization along [0,1,−1].

Figure 9:
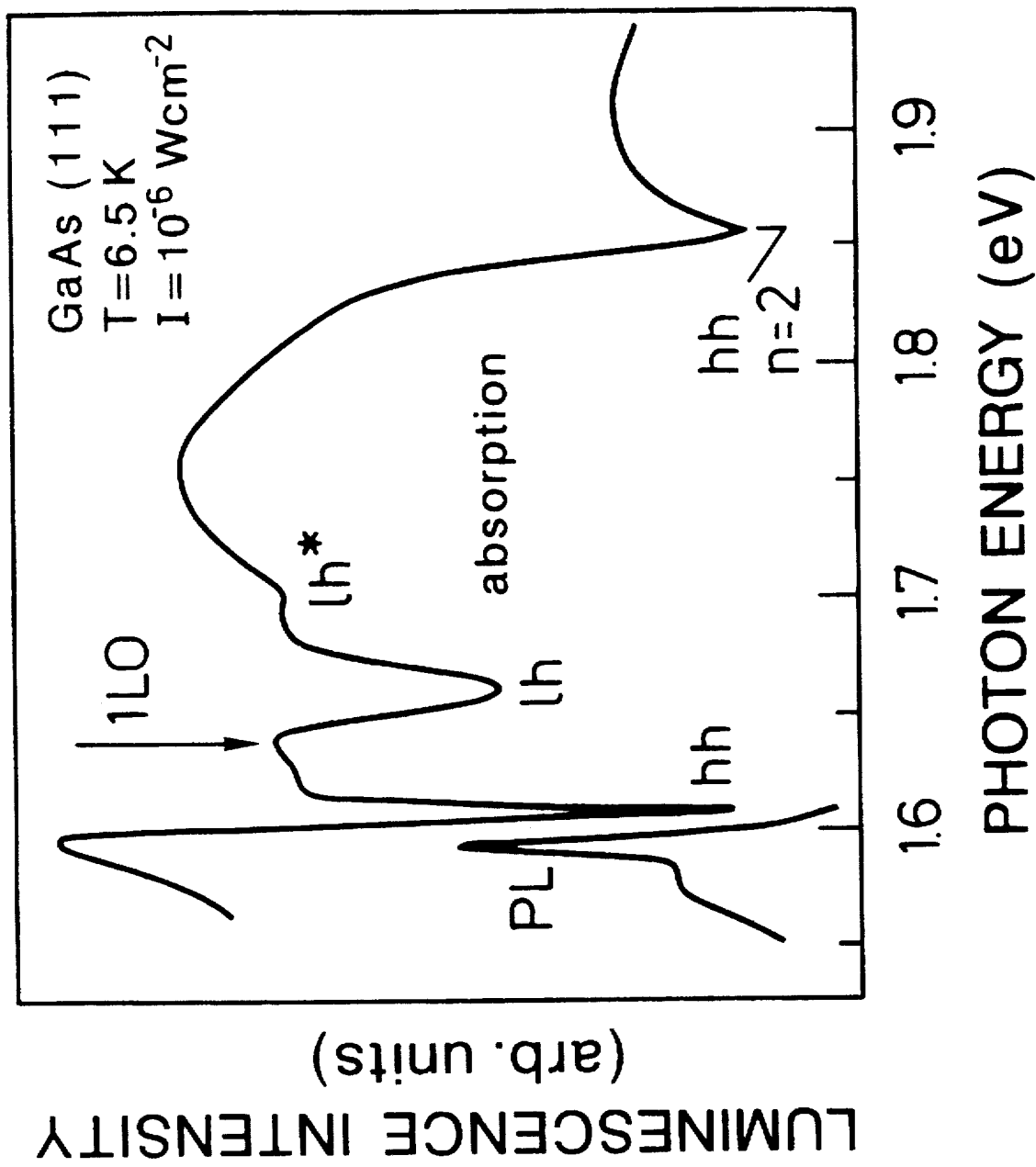

No optical anisotropy is observed for the (100) and (111) samples as expected for quantum-wells and also for the symmetric surface structure deduced for the (111) orientation. The additional lateral confinement existing in the (111) sample manifests itself in the strongly increased exciton binding energy and in the apearance of phonon lines in the PLE spectra. The excited lh exciton state is observed also in the absorption spectrum shown in FIG. 9 which was obtained by detecting the PL of the GaAs buffer layer. The enhanced hh resonance for (111)-samples can be attributed to a peaked density of states given by the highly symmetric surface structure, thus evidencing strong confinement. This is further suggested by pronounced absorption minima at energies above the hh state and between the lh- and hh (n=2) state, and by the absence of the 1LO phonon line in the PLE spectra, which coincides in energy with the minimum in the absorption above the hh state (FIG. 9).

To summarise the investigation has clearly demonstrated the formation of highly ordered surface structures on (211), (311), and (111) GaAs substrates. During molecular beam epitaxy the flat surfaces are found to break up into regular facets having nanometer scale dimensions, which can be directly monitored by RHEED. The surface structures result in distinct energy shifts of the luminescence in GaAs/AlAs multilayer structures. The additional lateral confinement leads to increased exciton binding energies, enhanced exciton-phonon interaction and pronounced optical anisotropy. The observed surface structures offer a unified picture to explain previous unclear results, and from a practical viewpoint they provide a unique method to directly synthesise quantum-wire and quantum-dot semiconductor devices of small size with substantially improved properties. The formation of nanometer-scale structures directly during epitaxy is not limited to the orientations discussed here. First results on the (110) orientation, for example, show a behaviour similar to that of the (311) sample. Hence, a variety of different structures could be realised also on other crystallographic orientations and material systems, opening a wide field of exciting improved semiconductor devices.

Figure 11:
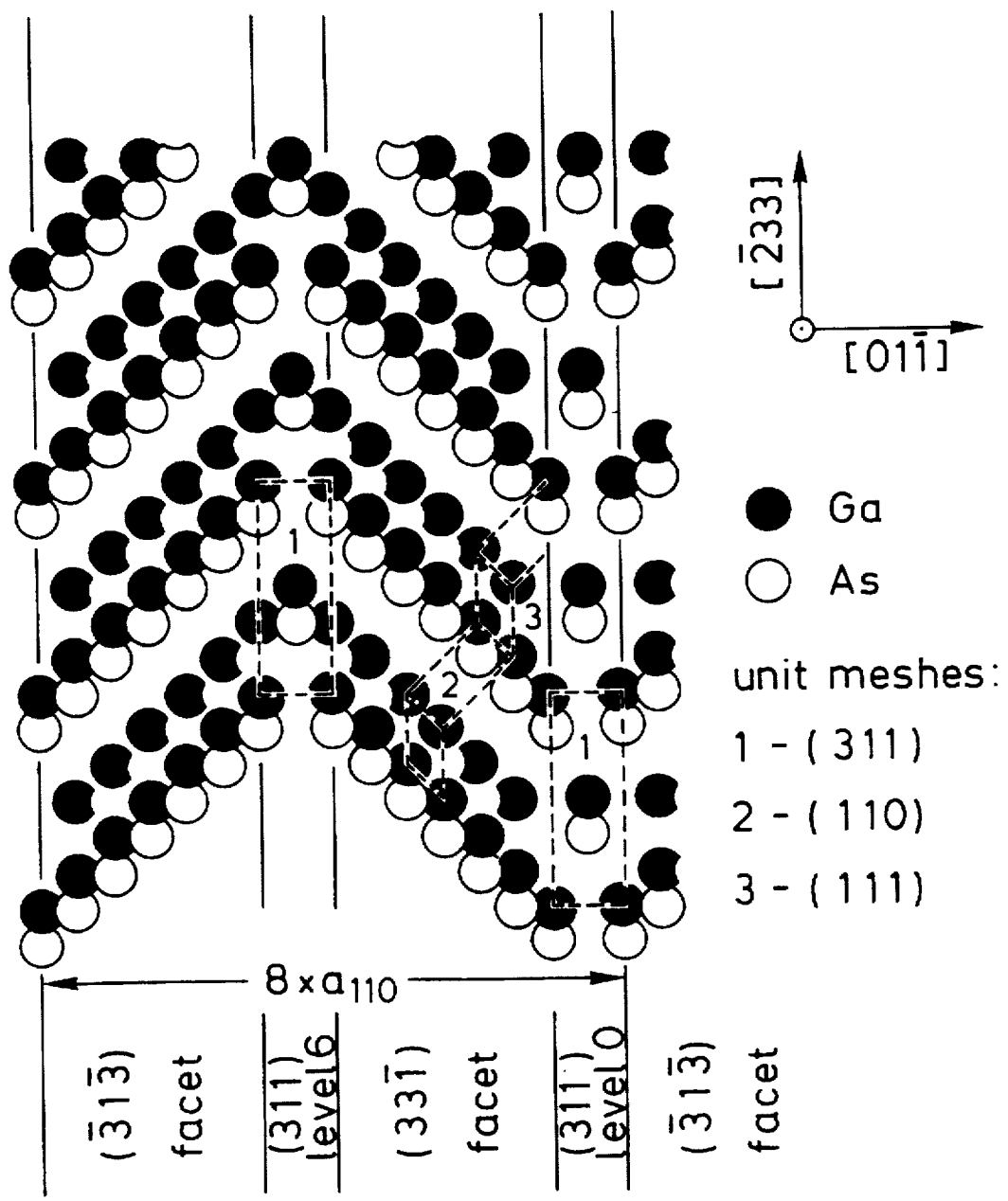

Attention is drawn to FIG. 11 which shows a crystallographic model of the stepped surface of a QWW SL grown on a (311)-A GaAs surface. The crystallographic model shows the stepped surface including the surface atoms with one or more dangling bonds. It clarifies the energetic benefit for the breaking up of the (311) surface in the described manner. It can be seen that the {331} facets are composed of stripes of alternating (110) and (111) surface configurations corresponding to low-index planes with low surface energy. In addition, the specified periodicity and step height leads to a nearly perfect stoichiometry of the stepped surface with an As/Ga ratio of 13/12.

The RHEED intensity dynamics inspected along the [−2, 3,3] azimuth during the growth of the GaAs/AlAs multilayer structures show pronounced oscillations at the onset of GaAs and AlAs growth. As calculated from the respective growth rates, the oscillation corresponds to the deposition of three (311) monolayers i.e. lattice planes. During the deposition of the next three monolayers, the intensity approaches the value corresponding to the RHEED pattern of the stable stepped surface during growth. The whole sequence is the consequence of a phase change of the surface corrugation as illustrated by the upper (shaded) surface in FIG. 2a, including quasi-flattening during the first three monolayer deposition and re-arrangement of the stepped surface during the second three monolayer deposition. It is assumed that this phase change is induced by strain which plays an important role here and makes the heterogenous growth on the facets energetically less favourable. As a consequence, the complete structure consists of well ordered alternating thicker and thinner regions of GaAs and AlAs oriented along the |−2,3,3] direction, and this unique arrangement indeed forms an as-grown QWW SL.

As described in the brief caption to the drawings FIGS. 13 to 18 illustrate, for the sake of completeness the typical material layers and thicknesses of a photodiode (or photocell), of a resonant tunneling transistor, of a far infrared emitter (or detector), of an optical modulator, of a bipolar transistor and of a high mobility electron transistor respectively. In the examples all the devices are illustrated as being realised in the GaAs or GaAs/Al$_x$Ga$_{1-x}$As material systems. It will however be understood that the same types of devices can be realised in other semiconductor material systems and that the actual layer materials used in such devices will be readily apparent to those skilled in the art. The devices shown in FIGS. 13 to 18 are distinguished from the known prior art devices by the special quantum well structure and by the length and width dimensions which are all equal to or below 500 Å and preferably equal to or below 300 Å. It is not readily possible to give a lower limit for the lateral dimension of the components however dimensions of 300 Å or less are already very small and it is unlikely that devices of the kind described will be made with lateral dimensions very much lower than 300 Å—but this is not precluded.

The doped layers of material are characterised by the letters n- or p- depending on the precise conductivity type in accordance with standard practice. Layers not designated by n- or p- are assumed to be of intrinsic, substantially undoped material. The layer thicknesses given are typical of this used in known prior art components.

When making these components with the method of the invention this active layers will generally be manufactured with layer thicknesses under 50 A but this is not critical. The steps in FIG. 17 are for the provision of contacts.

Finally, it is interesting to consider some theoretical aspects of the optical properties of the new structures.

The anisotropy of the optical properties is a clear proof of the existence of quantum wells and quantum wires. As the GaAs electron wavefunction has s-symmetry, the evaluated transition matrix element between electrons and holes in the electric dipole approximation has the symmetry of the hole wavefunction. In analogy to the behaviour of sound in an elastic medium, light holes can be described as partly longitudinal waves which travel faster than heavy holes described as transverse waves. The evaluation of the Kane matrix element reflects this behaviour. The transistions between electron- and heavy-hole states are polarized perpendicular to the hole momentum k, and the transitions between electrons and light holes are partly polarized parallel and perpendicular to k with relative transition intensities of ⅔ and ⅓, respectively. In the case of GaAs quantum wells, due to the momentum quantization in the z-(growth) direction, the in-plane absorption and luminescence spectra show the heavy-hole exciton only for light polarized perpendicular to z, while the light-hole exciton is much more pronounced for light polarized parallel to z. In analogy, for quantum-wire structures, the heavy-hole exciton is expected to be increased with light polarized parallel to the wire axis (s-polarization) and suppressed with light polarized perpendicular to the wire axis (p-polarization), whereas the light-hole exciton is expected to be increased with light polarized perpendicular to the wires and suppressed with light polarized parallel to the wires. However, for quantum wires the degree of polarization will be much lower than for quantum wells because, contrary to the case of the in-plane absorption in quantum wells, the quantization of k is relevant for two directions. This additional confinement causes a mixing between the heavy-and-light-hole states even for zero k along the quantum-wire axis which alters the anisotropy of the transitions. Nevertheless, a clear polarization anisotropy is expected in nanometer scale quantum wires with lateral dimensions comparable to the vertical ones.

According to the theory, the existence of GaAs QWW SL on the (311) substrate is confirmed by a strong polarization anisotropy of the excitonic resonances. The PL, PLE and the photoluminescence suppression (PLS) spectra of the GaAs buffer layer luminescence were determined for a 66 Å GaAs QWW SL. The narrow linewidth of 5 meV of the PL line reflects the high structural perfection of the QWW SL. The PLE spectra clearly evidence the 1D confinement. With the light polarized parallel to the wires, the heavy-hole resonance is more pronounced compared to the case with the light polarized perpendicular to the wires, where the light-hole resonance is more intense. The optical anisotropy is further demonstrated in the PLS spectra. By detecting the luminescence of the GaAs buffer layer, this method measures directly the absorption of the QWW SL, and hence the intrinsic polarization anisotropy of the 1D excitonic transitions of the present structure can be determined accurately. The observed optical anisotropy is of the order of 15 percent for the heavy-hole exciton resonance and 30 percent for the light-hole exciton resonance. This magnitude of the optical anisotropy is quite realistic for the present structure where the finite barrier heights and the sophisticated shape of the quantum wires has to be considered. In addition, the corresponding polarization anisotropy also exists in the room temperature luminescence of the QWW SL, where the free electron-heavy-hole and electron-light-hole transitions are observed. It should be noted here, that for the (100) SL reference sample grown side by side, and also for the luminescence of the GaAs buffer layer of the QWW SL, no polarization dependence is observed.

To complete the picture, the in-plane luminescence from the cleavage planes was investigated for the reference SL and the QWW SL. The in-plane luminescence of the SL is polarized perpendicular to the z-(growth) direction, whereas the in-plane luminescence of the QWW SL shows a pronounced component which is polarized parallel to the z-direction. This component of the luminescence is even more pronounced for the case of the quantum wires aligned perpendicular to the cleavage plane as compared to the case where the alignment is parallel to this plane. This behaviour again demonstrates the influence of the additional 1D confinement on the optical anisotropy and shows that the quantization of k is also relevant for a direction perpendicular to the z-direction.

If the detection wavelength is set to the high-energy side of the luminescence line, sharp lines in the low-excitation intensity ($10^{-6}$ Wcm$^{-2}$) PLE spectra of the QWW SL are resolved. The peak energies are separated by 36 meV and 12 meV, and hence the lines correspond to LO and TA phonon related lines. The PLE spectra of the reference SL show only one very weak LO phonon line. The PLE spectra of the reference SL show only one very weak LO phonon line. The appearance of these strong phonon related lines in the QWW SL is thus connected with the additional lateral confinement. Their origin due to Raman-scattering seems unlikely since the lines do not maintain circular and linear polarization and they broaden up to 10 meV if the detection wavelength is set to lower energies. On the other hand, a distinction between resonant RAMAN-scattering and hot-exciton luminescence is impossible in principle when strongly mixed exciton-photon (polariton) states are involved in the emission process. The lines are attributed to the resonant emission of phonons from excitons excited in the 1D continuum. In general the occurrence of phonon related lines is indicative for excitons in materials with strong exciton-phonon coupling. Recently, these lines were found in the PL spectra of direct-bandgap quantum wells in high magnetic fields. In the GaAs QWW SL's investigated in relation to the present disclosure, the additional exciton confinement and the resulting increase of the exciton binding energy up to 30 meV are responsible for this behaviour. This binding energy is estimated from the observed energy difference between the ground- and excited heavy-hole exciton states for a 56 Å GaAs QWW SL. The additional confinement leads to an increased probability for the excitons created in the 1D continuum to relax and recombine as a whole and, hence, increased interaction of phonons with the excitons is observed. For excitation energies in the 2D continuum, however, strong damping of the phonon lines is expected. It is important to note that this energy threshold provides an estimate of the 2D confinement energy. The described behaviour has been observed for different QWW SL samples with GaAs layer thicknesses of 66, 56, and 43 Å. In the case of the 66 Å GaAs QWW SL damping exists already for the second LO phonon line. However, for the 56 and 43 Å GaAs QWW SL, the phonon lines are observed with equal intensities up to the 2 LO+TA phonon line, whereas the next following phonon lines are strongly damped. The appearance of the undamped phonon lines up to higher energies for decreasing GaAs layer thickness reflects the corresponding increase of the 1D confinement energy. The striking result is that the 1D exciton confinement energy ($E_{SL}-E_{QWW\ SL}$), estimated from this behaviour, reaches values up to 90 meV for the 43 Å GaAs QWW SL. The increased interaction with phonons can be observed also on the low energy side of the luminescence spectra of the QWW SL at low temperatures, where in contrast to the reference SL, the LO phonon replica are found to be strongly enhanced.

Although of the same average layer thicknesses, the luminescence line of the QWW SL is shifted to lower energies compared to the (100) reference sample grown side by side. This red shift is due to the fact that the luminescence of the QwW SL originates from transitions in the thicker GaAs quantum-wire regions. The red shift increases from 3-5 meV for the 66 Å GaAs sample to 40 meV for the 43 Å GaAs sample as can be seen from the corresponding PL spectra at 300K. This variation reflects the increased influence of the interface corrugation for decreases GaAs layer thickness.

The QWW SL's in general exhibit an extremely high integrated luminescence intensity which is comparable to the (100) reference sample at 6.5K. Even at moderate excitation densities of the order of 10 Wcm$^{-2}$, unity quantum efficiency is achieved. At room temperature, however, the integrated luminescence intensity of the 66 Å GaAs QWW SL is comparable to that of the reference SL sample, whereas for the 43 Å Ga As QWW SL the integrated luminescence intensity is more than one order of magnitude higher than that of the reference SL sample and does not degrade up to 400K. This behaviour again arises from the additional 1D confinement of the present structure. The nonradiative interface recombination is in this case strongly suppressed due to the reduced spreading of the carriers which is now possible only in the direction parallel to the wires. To achieve the desired confinement of the carriers at room temperature, however, the average GaAs layer thickness has to be thinner than 66 Å which is in agreement with the estimate of the 1D confinement energy given before. This finding is important for the design of light emitting devices of high efficiency at room temperature.

As a final point of the optical properties, some interesting phenomena should be outlined concerning short period (SP) QWW SL. The SP QWW SL and the reference SP SL become indirect for GaAs and AlAs layer thicknesses below 35 Å. The PL spectra shown in FIG. 8a, b reveal a strong zero phonon line and weak phonon sidebands and are typical for the conduction band minimum to be at the $X_z$-point in the AlAs layers. Although the SP QWW SL are of high structural perfection, the PLE spectra reveal a smooth onset and a pronounced overlap with the PL line. This behaviour shows a strong mixing between the $\Gamma$ and $X_2$ minima which is assumed to be due to the interface corrugation. In contrast, the PLE spectra of the SP SL show a sharp onset well separated from the PL line. The strong $\Gamma$-$X_z$ mixing, even for type-II SP QWW SL with a high energy separation between the $\Gamma$ and X minima results in an integrated luminescence intensity which does not degrade significantly up to room temperature. This finding offers the possibility to fabricate optical devices which work with high efficiency at energies even above the limit for direct-gap GaAs/Al$_x$Ga$_{1-x}$As SL.

For SP QWW SL with layer thicknesses below 20 Å the phonon sidebands in the PL spectra are drastically increased with respect to the zero phonon line compared to the reference SP SL. Mixing is in this case absent.

Figure 12:
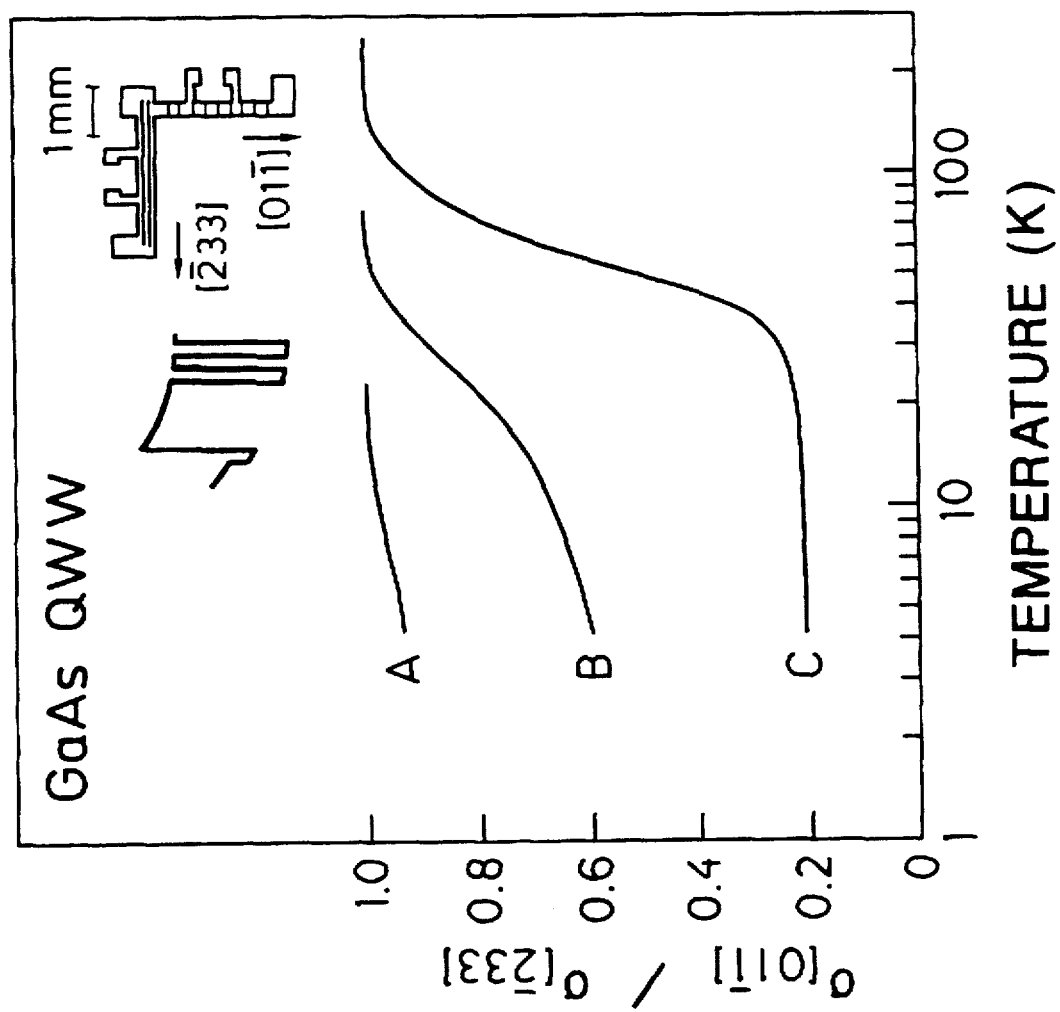
Figure 13:
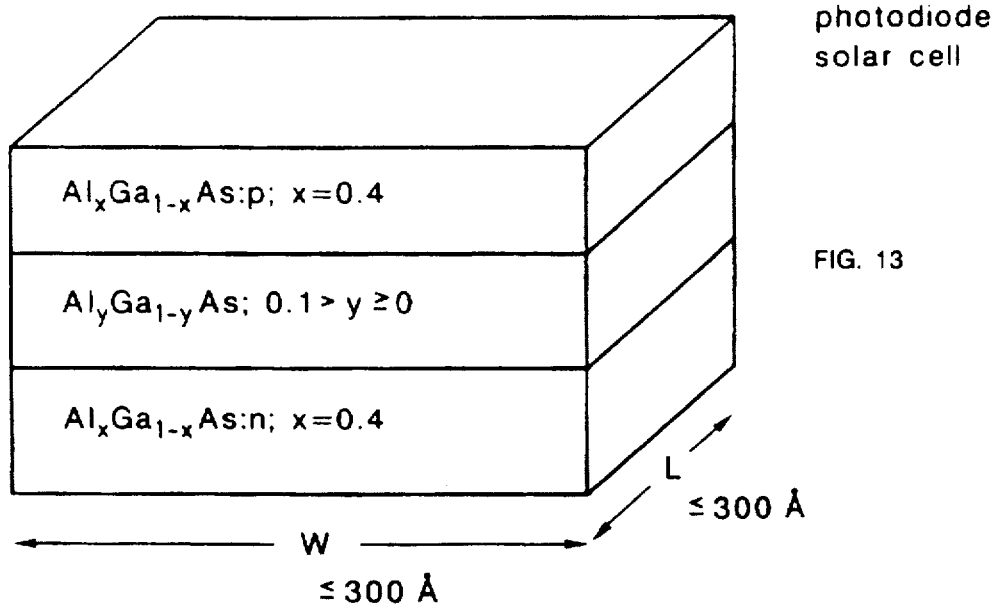
Figure 14:
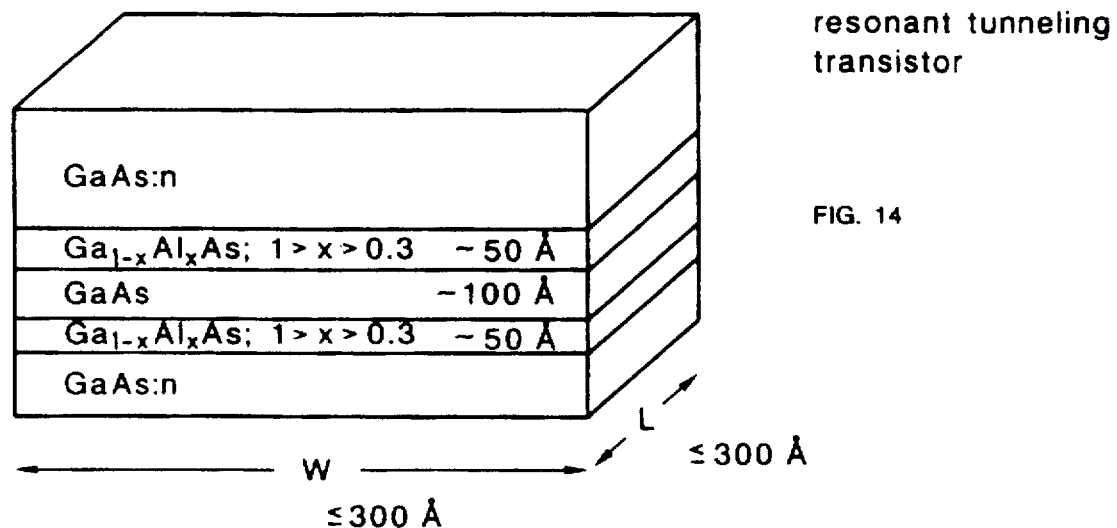
Figure 15:
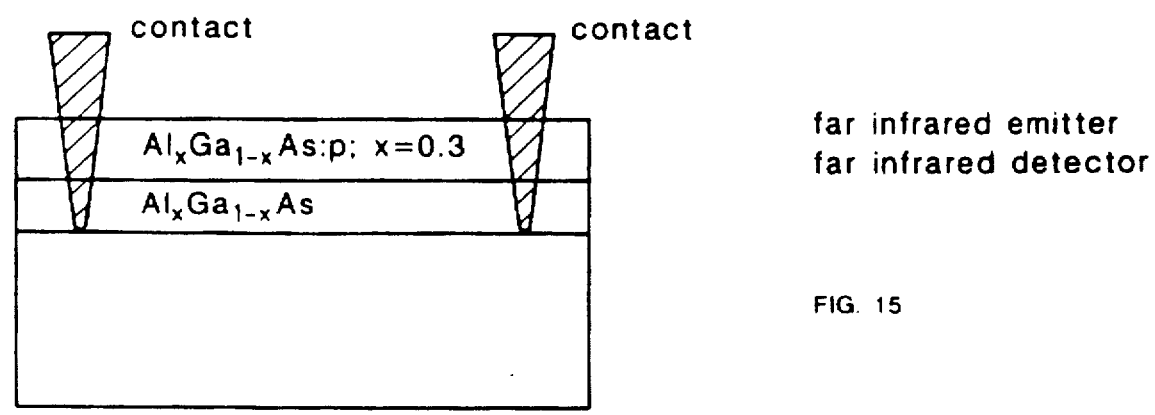

Additional confirmation of the 1D character of the present QWW SL structure is obtained from the anisotropy of the conductivity of Si-(p-type) modulation-doped GaAs quantum wires. The samples are mesa etched in an L-shaped geometry shown in the inset of FIG. 12. The four terminal conductivities perpendicular and parallel to the quantum wires are measured at a current of I=100 nA. The ratio of the conductivities perpendicular and parallel to the quantum wires as a function of the sample temperature is shown in FIG. 12. The curves correspond to different samples with average GaAs layer thicknesses of 80, 50, and 35 Å. The average density of holes per unit area deduced from Hall-measurements amounts to $2*10^{11}$ cm$^{-2}$ for the investigated samples. For the 80 Å GaAs quantum wire almost no anisotropic behaviour was observed. However, the anisotropy of the conductivity is increased from 1.6 for the 50 Å GaAs quantum wire to 4.6 for the 35 Å GaAs quantum wire at low temperature, whereby the observed onset of the anisotropy moves to higher temperatures. Since for the present carrier concentrations the wavevector of the lateral potential modulation $\pi/32$ Å exceeds the Fermi-wavevector by one order of magnitude, the dispersion relation of the holes is not expected to be altered drastically as in the case of planar superlattices. Additionally, for the 50 and 35 Å GaAs samples, the Fermi-energy is below the 1D confinement energy for holes estimated from the optical investigations. Therefore, it is assumed that the anisotropy of the conductivity in the present structures originates from the confinement of the holes in the quantum wires. From the observed onset of the anisotropy as a function of the temperature, the 1D confinement energies for the holes can be estimated very roughly to be 8 meV for the 35 Å GaAs quantum wire and 3 meV for the 50 Å GaAs quantum wire. These values are quite close to the values estimated for the 1D confinement energies for the holes from our optical investigations. In this sense, the electrical measurements complete the picture, that has been derived from the optical investigations.

We claim:

1. Semiconductor structure including a single crystal of a first material having a first surface with a periodic surface topography formed by crystallization only of the first material and defining a periodic array of facets and macrosteps, a layer of a second material grown over the first surface having a first side which corresponds to and forms an interface with the surface topography of the first surface, the layer having a second side with a periodic surface topography defining facets and macrosteps which correspond in size and shape to the facets and macrosteps of the first surface and which are laterally displaced by one half period relative to the facets and macrosteps of the first surface, and a further layer of the first material applied over the second side and forming a second interface with the facets and macrosteps of the layer of the second material, whereby the second material defines an array of at least one of quantum wires and quantum dots.

2. A semiconductor structure in accordance with claim 1, wherein said first surface is a {211} surface of a SiGe crystal lattice.

3. A semiconductor structure in accordance with claim 1, wherein said first surface is a {111} surface of a SiGe crystal lattice.

4. A semiconductor structure in accordance with claim 1, wherein said first surface is a {110} surface of a SiGe crystal lattice.

5. A semiconductor structure in accordance with claim 1, wherein said first surface is a {311} surface of GaAs-like or Si-like crystal lattice.

6. A semiconductor structure in accordance with claim 1, wherein said first surface is a {211} surface of a GaAs-like or Si-like crystal lattice.

7. A semiconductor structure in accordance with claim 1, wherein said first surface is a {111} surface of a GaAs-like or Si-like crystal lattice.

8. A semiconductor structure in accordance with claim 1, wherein said first surface is a {110} surface of a GaAs-like or Si-like crystal lattice.

9. A semiconductor structure in accordance with claim 1, wherein one of the first and second materials is selected from the group of materials consisting of GaAs and SiGe.

10. A semiconductor structure in accordance with claim 1, wherein Ga$_{1-x}$Al$_x$As with 0<x<1 is one of the first and second materials.

11. A semiconductor structure in accordance with claim 1, wherein AlAs is one of the first and second materials.

12. A semiconductor structure in accordance with claim 1, wherein GaAs is one of the materials and Ga$_{1-x}$Al$_x$As with 0<x<1 is the other of the materials.

13. A semiconductor structure in accordance with claim 1, wherein GaAs is one of the materials and AlAs is the other of the semiconductor materials.

14. A semiconductor structure in accordance with claim 1, wherein said array is a one-dimensional array of quantum well wires.

15. A semiconductor structure in accordance with claim 1, wherein said array is a two-dimensional array of quantum well wires.

16. A semiconductor structure in accordance with claim 1, wherein said array is a two-dimensional array of quantum dots.

17. A semiconductor structure in accordance with claim 1, wherein said array is a three-dimensional array of quantum dots.

18. A semiconductor structure in accordance with claim 1, wherein the array is an array of quantum well wires, and wherein said surface is a {311} surface of GaAs and said quantum well wires are oriented along [−2,3,3].

19. A semiconductor structure in accordance with claim 18, wherein said {311} surface has a corrugated shape characterized by:

(a) a periodicity along [0,1,−1] of about 32 Angstrom, (b) a peak to trough height difference of about 10.2 Angstrom, (c) first and second sets of terraces of about 4 Angstrom width in a {311} plane which form plateaus at said peaks and troughs of the corrugated shape respectively, and (d) first and second sets of facets in a [3,3,−1] and [−3,1,−3] respectively which correspond to inclined side walls of the corrugated shape.

20. A semiconductor structure in accordance with claim 1, which is in the form of a laser and which comprises in sequence:

(a) an n-type {311}A GaAs substrate, (b) a single or multilayer buffer, (c) an n-type layer of $Ga_{1-x}Al_xAs$, (d) a superlattice which forms said array of quantum well wires or quantum dots and which comprises a first layer of undoped $Ga_{1-y}Al_yAs$ with a thickness of less than the order of 60 Angstrom, a second layer of undoped $Ga_{1-z}Al_zAs$ with a thickness of less than the order of 60 Angstrom, and a third layer of undoped $Ga_{1-y}Al_yAs$ of a thickness less than the order of 60 Angstrom, (e) a p-type layer of $Ga_{1-x}Al_xAs$, and (f) a cap layer of p-type GaAs, there being provision for placement of contacts on said cap layer and on said n-type GaAs substrate.

21. A semiconductor structure in accordance with claim 20, wherein said n-type layer of $Ga_{1-x}Al_xAs$ has a thickness of the order of several thousand Angstrom.

22. A semiconductor structure in accordance with claim 20, wherein said n-type layer of $Ga_{1-x}Al_xAs$ has a composition of approximately x=0.4.

23. A semiconductor structure in accordance with claim 20, wherein, in said superlattice, said first layer of undoped $Ga_{1-y}Al_yAs$ has a composition of approximately y=0.2.

24. A semiconductor structure in accordance with claim 20, wherein, in said superlattice, said second layer of undoped $Ga_{1-z}Al_zAs$ has a composition of between z=0 and approximately z=0.1.

25. A semiconductor structure in accordance with claim 20, wherein said p-type of $Ga_{1-x}Al_xAs$ has a thickness of the order of several thousand Angstrom.

26. A semiconductor structure in accordance with claim 1, wherein said macrosteps have a step height of at least about 4 Å.

27. A semiconductor structure in accordance with claim 26, wherein said step height is at least about 10.2 Å.

28. Method of growing a periodic array of quantum wires or dots of a semiconductor structure on a surface of a single crystal, said single crystal being formed of atoms of a first material, the method comprising the steps of:

selecting crystal growth conditions causing the formation of a predetermined surface crystallization on said surface of said first material resulting from a spontaneous self-arrangement of said atoms at said surface, the predetermined surface crystallization forming a first periodic surface topography comprising facets and macrosteps;

exposing said surface to a flux of atoms of a second material for a predetermined time interval to grow a layer of the second material on said first material to thereby form a first interface between said first and second materials and having a first periodic structure corresponding to said first periodic surface topography, said predetermined time interval being of a sufficient duration so that the second material forms a second periodic surface topography which corresponds in period and form to that of said first periodic surface topography and which is laterally displaced by one half period relative to said first periodic surface topography; and directing a flux of said first atoms onto the second surface topography of the layer of the second material to grow a further first material on the layer and thereby form a second interface between the layer of said second material and said further first material having a second periodic structure corresponding to said second surface topography;

whereby a periodic array of at least one of quantum wires and quantum dots of said second material is embedded between said first material and said further first material.

29. Semiconductor structure including a single crystal in which a periodic array of quantum wires or dots extends in a plane, the single crystal being made up of a first material for cladding the array of quantum wires or dots on first and second sides of said plane and a second material for forming the array of quantum wires or dots, the quantum wires or dots being defined by a periodic surface topography formed by crystallization of the first material, the first and second materials being connected on the first side of said plane by a first interface and on the second side of said plane by a second interface, so that the first and second interfaces correspond in shape to the periodic surface topography, the first interface being further substantially a mirror image in said plane of the second interface, whereby the second material between the first and second interfaces defines the array of quantum wires or dots.

* * * * *